(12) United States Patent
Wang et al.

(10) Patent No.: US 11,233,044 B2
(45) Date of Patent: Jan. 25, 2022

(54) SEMICONDUCTOR DEVICE

(71) Applicant: SOCIONEXT INC., Kanagawa (JP)

(72) Inventors: Wenzhen Wang, Yokohama (JP);
Hirotaka Takeno, Yokohama (JP);
Atsushi Okamoto, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 7 days.

(21) Appl. No.: 17/014,662

(22) Filed: Sep. 8, 2020

(65) Prior Publication Data
US 2020/0411502 A1 Dec. 31, 2020

Related U.S. Application Data

(63) Continuation of application No. 16/438,026, filed on Jun. 11, 2019, now Pat. No. 10,797,042.

(30) Foreign Application Priority Data

Jun. 25, 2018 (JP) .............................. JP2018-119819

(51) Int. Cl.
*H01L 27/02* (2006.01)
*H01L 27/092* (2006.01)
(Continued)

(52) U.S. Cl.
CPC ...... *H01L 27/0207* (2013.01); *H01L 23/5226* (2013.01); *H01L 23/5283* (2013.01);
(Continued)

(58) Field of Classification Search
CPC ............. H01L 27/0207; H01L 27/0928; H01L 23/5226; H01L 23/5283; H01L 29/0696; H01L 29/7851
(Continued)

(56) References Cited

U.S. PATENT DOCUMENTS 7,142,019 B2  11/2006 Mair et al.
10,192,859 B2 * 1/2019 Aton ................... H01L 27/0251
(Continued)

FOREIGN PATENT DOCUMENTS

JP 2011-049477 A 3/2011
JP 2014-072488 A 4/2014
WO 2017/208888 A1 12/2017

OTHER PUBLICATIONS

Notice of Allowance issued in U.S. Appl. No. 16/438,026, dated Jun. 8, 2020.

*Primary Examiner* — Tu-Tu V Ho
(74) *Attorney, Agent, or Firm* — McDermott Will and Emery LLP

(57) ABSTRACT

A semiconductor device includes a semiconductor substrate, a first standard cell including a first active region and a second active region, and a power switching circuit including a first switching transistor electrically connected between a first interconnect and a second interconnect over the semiconductor substrate, and including a first buffer connected to a gate of the first switching transistor, the first buffer including a third active region and a fourth active region, and wherein the first buffer adjoins, in a plan view, the first standard cell in a first direction, wherein an arrangement of the first active region matches an arrangement of the third active region in a second direction different from the first direction, and wherein an arrangement of the second active region matches an arrangement of the fourth active region in the second direction.

9 Claims, 26 Drawing Sheets

(51) Int. Cl.
   *H01L 29/06* (2006.01)
   *H01L 23/528* (2006.01)
   *H01L 29/78* (2006.01)
   *H01L 23/522* (2006.01)
(52) U.S. Cl.
   CPC ...... *H01L 27/0928* (2013.01); *H01L 29/0696* (2013.01); *H01L 29/7851* (2013.01)
(58) Field of Classification Search
   USPC .......................................................... 257/401
   See application file for complete search history.

(56) References Cited

U.S. PATENT DOCUMENTS

| | | |
|---|---|---|
| 2011/0049575 A1 | 3/2011 | Tanaka |
| 2016/0233859 A1 | 8/2016 | Roberts et al. |
| 2017/0331472 A1 | 11/2017 | Ogata |
| 2018/0254778 A1 | 9/2018 | Rios et al. |

* cited by examiner

SEMICONDUCTOR DEVICE

CROSS-REFERENCE TO RELATED APPLICATION

This application is a Continuation application of U.S. patent application Ser. No. 16/438,026, filed on Jun. 11, 2019, which is based upon and claims the benefit of priority of the Japanese Patent Application No. 2018-119819, filed on Jun. 25, 2018, the entire contents of which are incorporated herein by reference.

BACKGROUND OF THE INVENTION

1. Field of the Invention

The present disclosure relates to a semiconductor device.

2. Description of the Related Art

A semiconductor device includes various circuit regions, and a standard cell region is used as a circuit region by way of example. In such a standard cell region, various logical circuits and power switching circuits are arranged.

For example, a power switching circuit is disposed between a power supply interconnect with supplied Vdd potential and an interconnect for supplying VVdd power to transistors in logical circuits. The VVdd power to the transistors is switched on or off by the power switching circuit. With use of the power switching circuit, power supply is switched off when the logical circuit does not need to operate whereby leak current of the transistors of the logical circuit is decreased. This can reduce power consumption. See, for example, U.S. Pat. No. 7,142,019, U.S. Publication No. 2017/0331472, Japanese Laid-Open Patent Publication Nos. 2014-072488; 2011-049477, WO 2017/208888.

However, the logical circuit in proximity of the power switching circuit may have variations of electrical characteristics, and thus the logical circuit may fail to achieve desired specifications.

SUMMARY OF THE INVENTION

The embodiments of the present disclosure provide a semiconductor device including a logical circuit so as to decrease its variations of electrical characteristics.

According to one aspect of the present disclosure, a semiconductor device includes a semiconductor substrate, a first standard cell including a first active region and a second active region, and a power switching circuit including a first switching transistor electrically connected between a first interconnect and a second interconnect over the semiconductor substrate, and including a first buffer connected to a gate of the first switching transistor, the first buffer including a third active region and a fourth active region, and wherein the first buffer adjoins, in a plan view, the first standard cell in a first direction, wherein an arrangement of the first active region matches an arrangement of the third active region in a second direction different from the first direction, and wherein an arrangement of the second active region matches an arrangement of the fourth active region in the second direction.

DESCRIPTION OF THE PREFERRED EMBODIMENTS

With respect to conventional semiconductor devices, the inventors have recognized that their logical circuits may suffer from an irregular operation. After careful consideration, it has been found by the inventors that, in a case where there is a design difference of the arrangement of active regions between a power switching circuit and a standard cell in which logical circuits are disposed, transistors in the standard cell may have variations of electrical characteristics. For example, with respect to the power switching circuit and the standard cell, in a case where, in a direction perpendicular to a direction in which they are arranged side by side, there is a design difference of the size between their active regions or distance between their adjacent active regions, transistors in the standard cell may have variations of electrical characteristics during manufacturing. Such variations of electrical characteristics of the transistors may result in not being able to obtain expected characteristics of the logical circuit.

In view of the above recognition, it has been found by the inventors that such variations of electrical characteristics are suppressed in a case where active regions whose arrangement matches an arrangement of active regions in the standard cell are disposed in an area adjacent to the standard region. Hereafter, the embodiments will be explained with reference to the drawings.

First Embodiment

Figure 1:
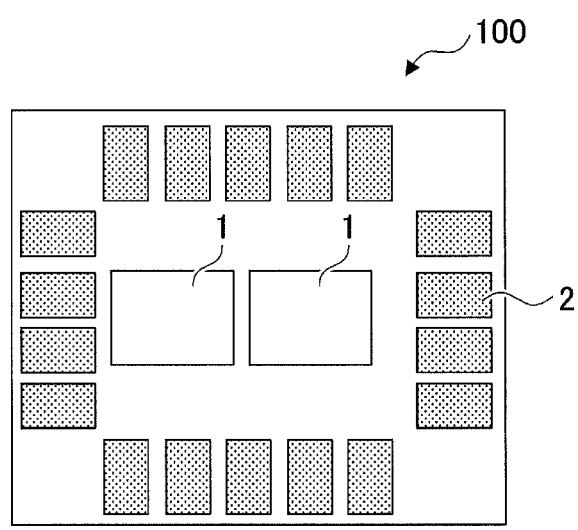
FIG. 1 is a diagram illustrating an example of a layout of a semiconductor device according to a first embodiment.
Figure 2:
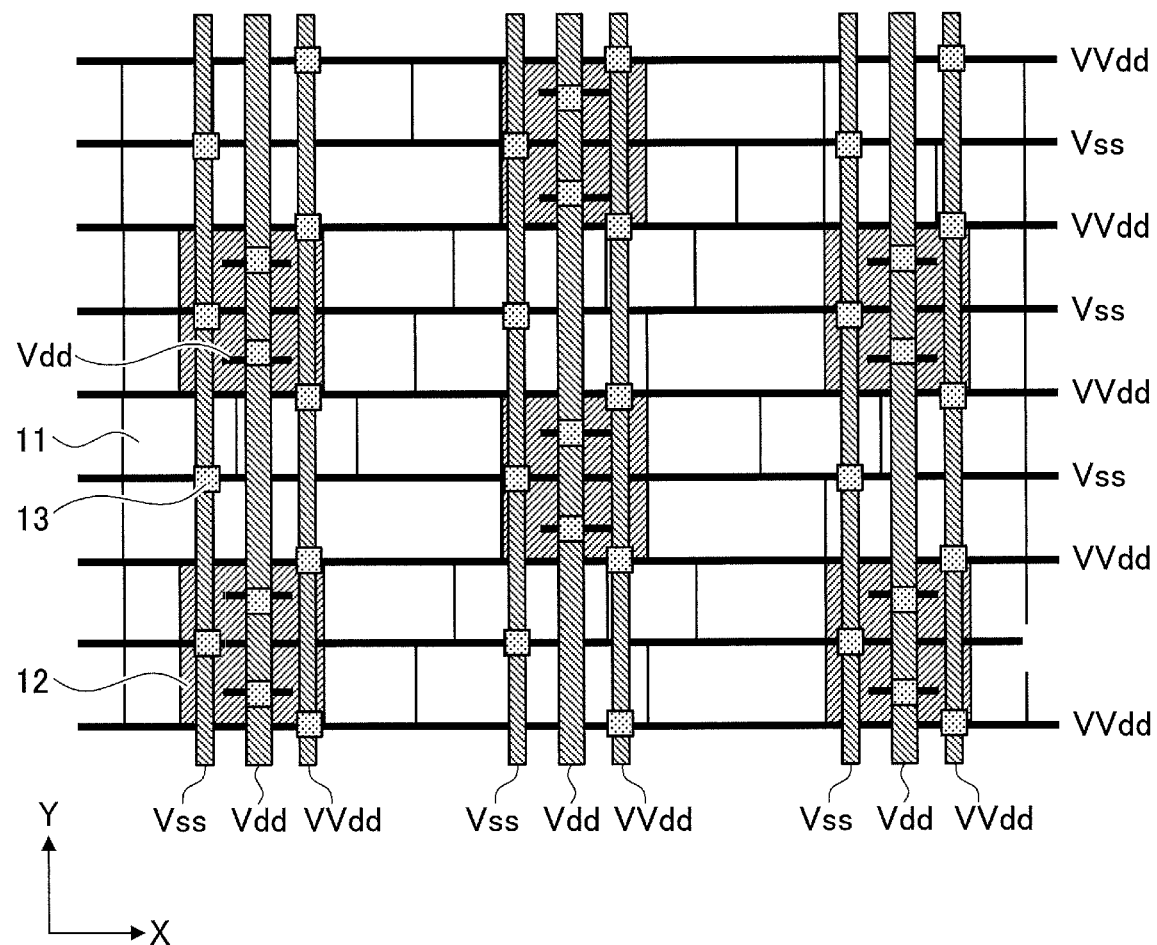
FIG. 2 is a diagram illustrating an example of an enlargement of a part of a standard cell region.

A first embodiment is described hereafter. FIG. 1 is a diagram illustrating an example of a layout of a semiconductor device according to a first embodiment. FIG. 2 is a diagram illustrating an example of an enlargement of part of a standard cell region.

As illustrated in FIG. 1, a semiconductor device 100 according to the first embodiment includes a plurality of standard cell regions 1, and input and output (I/O) cell regions 2 around the standard cell regions 1. As illustrated in FIG. 2, in the standard cell region 1, a plurality of standard cells 11 and a plurality of power switching circuits 12 are arranged. The standard cells 11 each include various logical circuits such as a NAND circuit and an inverter circuit. In the standard cell region 1, Vss interconnects for supplying a ground potential to the standard cells 11, as well as VVdd interconnects for supplying a power supply potential to the standard cells 11, are arranged. In the present embodiment, a Vss interconnect and a VVdd interconnect are each extended in an X direction, and they are alternately arranged in a Y direction perpendicular to the X direction. For example, the standard cells 11 are each disposed in a plan view, between an adjacent VVdd interconnect and Vss interconnect.

In this description, in the Y direction, a distance between the Vss interconnect and the VVdd interconnect adjacent thereto is referred to as a height. When a standard cell 11 or a power switching circuit 12 is of one height in the Y direction, it is referred to as a single height cell. When a standard cell 11 or a power switching circuit 12 is of two or more heights in the Y direction, it is referred to as a multi-height cell. In the case of two heights, it is referred to as a double height cell.

In the layout of FIG. 2, in the standard cell region 1, in a plan view, the Vss interconnects that extend in the X direction, and the VVdd interconnects that extend in the X direction are alternately arranged. Also, in each of the power switching circuits 12 disposed in the standard cell region 1, Vdd interconnects are arranged. Also, with respect to the standard cell region 1, in an interconnect layer, a plurality of Vss interconnects, a plurality of VVdd interconnects and a plurality of Vdd interconnects, which all extend in the Y direction, are arranged, the interconnect layer being different from the Vss interconnects and the VVdd interconnects that extend in the X direction as well as differing from the Vdd interconnects in the power switching circuits 12. The Vss interconnects extending in the X direction are each connected to a corresponding Vss interconnect extending in the Y direction through a corresponding via 13. The VVdd interconnects extending in the X direction are each connected to a corresponding VVdd interconnect extending in the Y direction through a corresponding via 13. The Vdd interconnects in the power switching circuit 12 are each connected to a corresponding Vdd interconnect extending in the Y direction through a corresponding via 13. Note that the Vdd interconnects in the power switching circuit 12 may be formed in an interconnect layer different from the Vss interconnect and the VVdd interconnects that extend in the X direction. Alternatively, the Vdd interconnects in the power switching circuit 12 may be formed in a same interconnect layer as the Vss interconnect and the VVdd interconnects that extend in the X direction. By way of example, the power switching circuit 12 is disposed between two adjacent VVdd interconnects, on both sides of the Vss interconnect. In this case, the power switching circuit 12 is a double height cell. The Vdd interconnects of the power switching circuit 12 are supplied with a power supply potential from the outside. The power switching circuit 12 performs switching to supply a potential through the Vdd interconnect to the VVdd interconnect or shut off a potential supplied through the Vdd interconnect (on or off).

Figure 3:
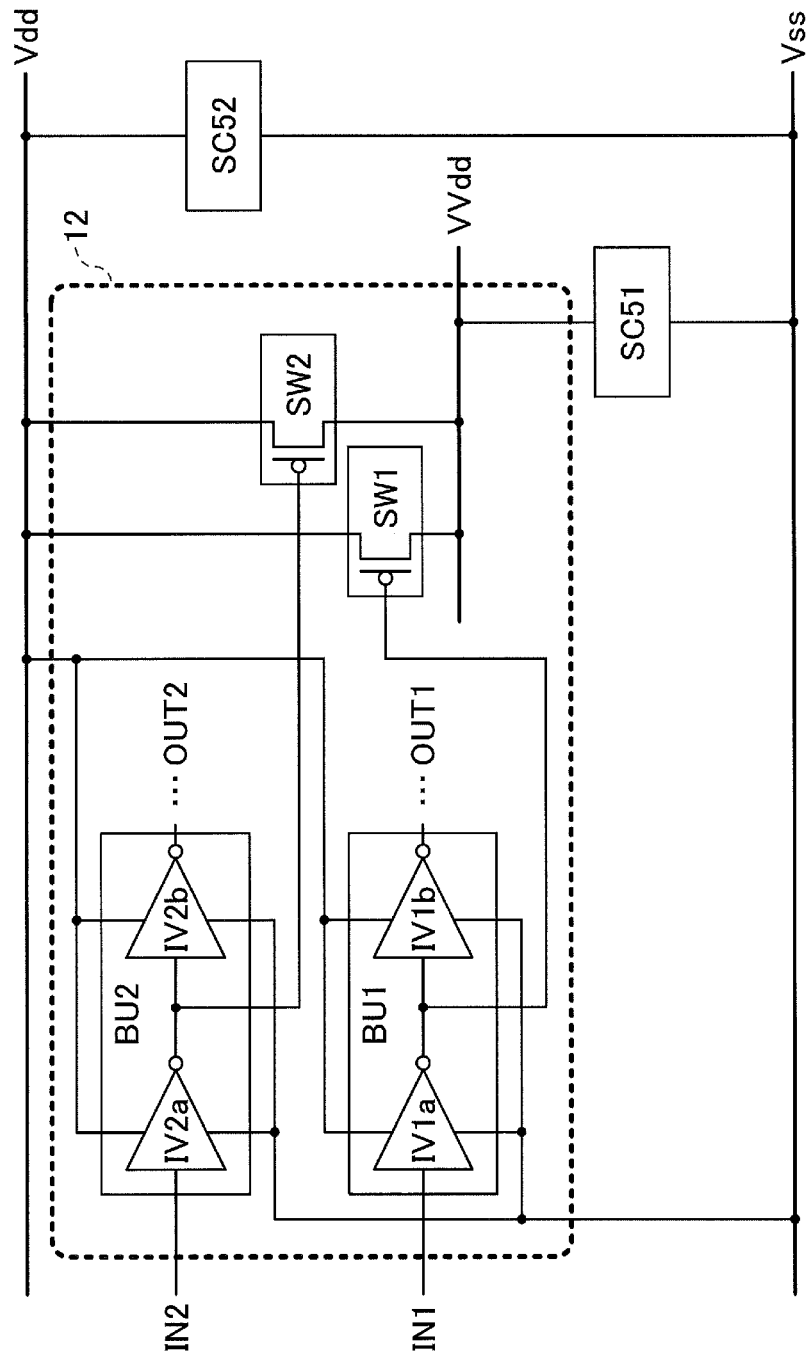
FIG. 3 is a circuit view illustrating an example of a configuration of a power switching circuit.

A configuration of the power switching circuit 12 is described hereafter. FIG. 3 is a circuit view illustrating an example of the configuration of the power switching circuit.

As illustrated in FIG. 3, the power switching circuit 12 includes a first switching transistor SW1 and a second switching transistor SW2, which are each connected between the Vdd interconnect and the VVdd interconnect. For example, each of the first switching transistor SW1 and the second switching transistor SW2 is a P-channel MOS transistor. The power switching circuit 12 also includes a first buffer BU connected to a gate of the first switching transistor SW1 and a second buffer BU2 connected to a gate of the second switching transistor SW2.

Figure 4A:
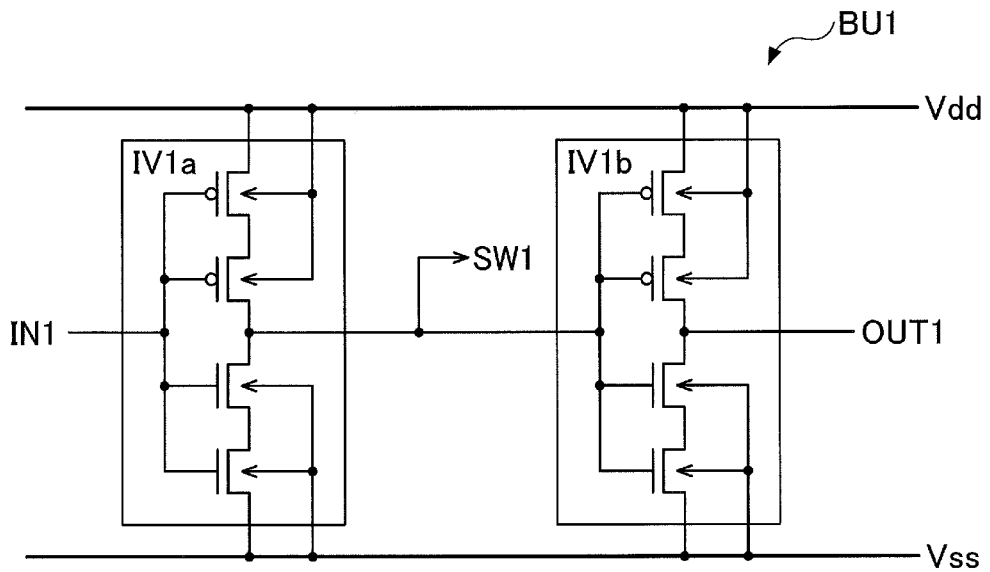
FIG. 4A is a circuit view illustrating an example of a configuration of a first buffer.
Figure 4B:
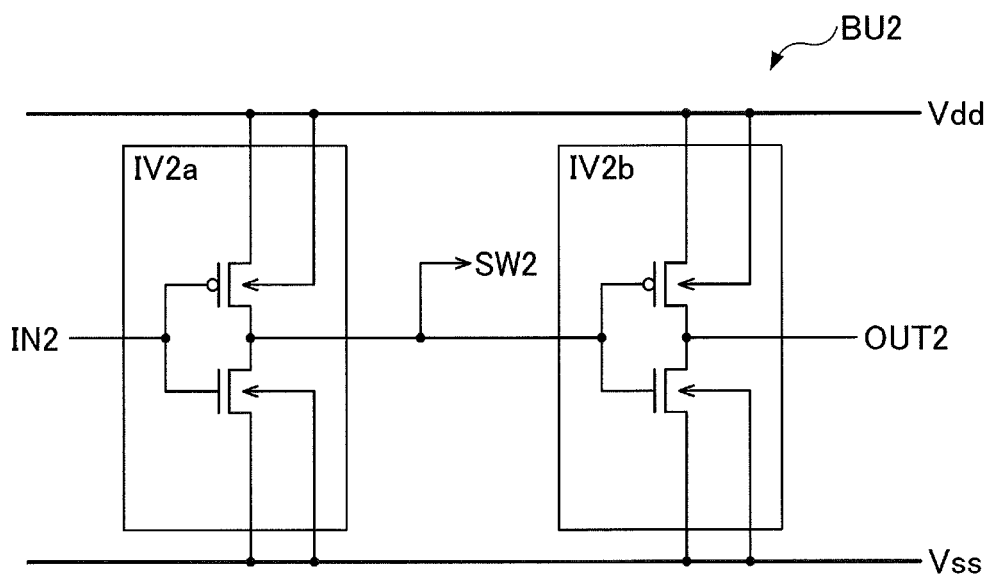
FIG. 4B is a circuit view illustrating an example of a configuration of a second buffer.

Hereafter, a configuration of the first buffer BU1 and the second buffer BU2 is described. FIG. 4A is a circuit view illustrating an example of the configuration of the first buffer. FIG. 4B is a circuit view illustrating an example of the configuration of the second buffer.

As illustrated in FIG. 4A, the first buffer BU1 includes an inverter IV1a and an inverter IV1b. An input signal IN1 is inputted into the inverter IV1a, and then output of the inverter IV1a is inputted into a gate of the first switching transistor SW1 and the inverter IV1b. The inverter IV1b outputs an output signal OUT1. The inverters IV1a and IV1b each have two P-channel MOS transistors and two N-channel MOS transistors. Note that the configuration of inverters IV1a and IV1b is merely an example, and for example, the inverters IV1a and IV1b may each have one P-channel MOS transistor and one N-channel MOS transistor.

As illustrated in FIG. 4B, the second buffer BU2 includes an inverter IV2a and an inverter IV2b. An input signal IN2 is inputted into the inverter IV2a, and then output of the inverter IV2a is inputted into a gate of the second switching transistor SW2 and the inverter IV2b. The inverter IV2b outputs an output signal OUT2. The inverters IV2a and IV2b each have one P-channel MOS transistor and one N-channel MOS transistor. Note that the configuration of inverters IV2a and IV2b is merely an example, and for example, the inverters IV2a and IV2b may each have two P-channel MOS transistors and two N-channel MOS transistors.

As described in detail below, an N-well with respect to the P-channel MOS transistor is, as a substrate potential, supplied with a Vdd power supply potential from the Vdd interconnect (power supply interconnect) through a well tap. Also, a P-well with respect to the N-channel MOS transistor is, as the supply potential, supplied with a Vss ground potential from the Vss interconnect (ground interconnect) through a well tap.

In the present embodiment, since the first switching transistor SW1 has lower drivability than the second switching transistor SW2, a current that flows through the first switching transistor SW1 is smaller than the second switching transistor SW2 in a case where the switching transistors SW1 and SW2 are switched on. For this reason, in a case where the second switching transistor SW2 is switched on after the first switching transistor SW1 is switched on, a potential supplied to the VVdd interconnect can be gradually increased. If a power supply potential is rapidly supplied to a standard cell SC51 through the VVdd interconnect, a power noise occurs in the Vdd interconnect. This may cause a malfunction, etc. in the standard cell SC52 that is supplied with a power supply potential through the Vdd interconnect. However, as described above, by gradually increasing a potential, the above malfunction, etc. can be suppressed.

Figure 5:
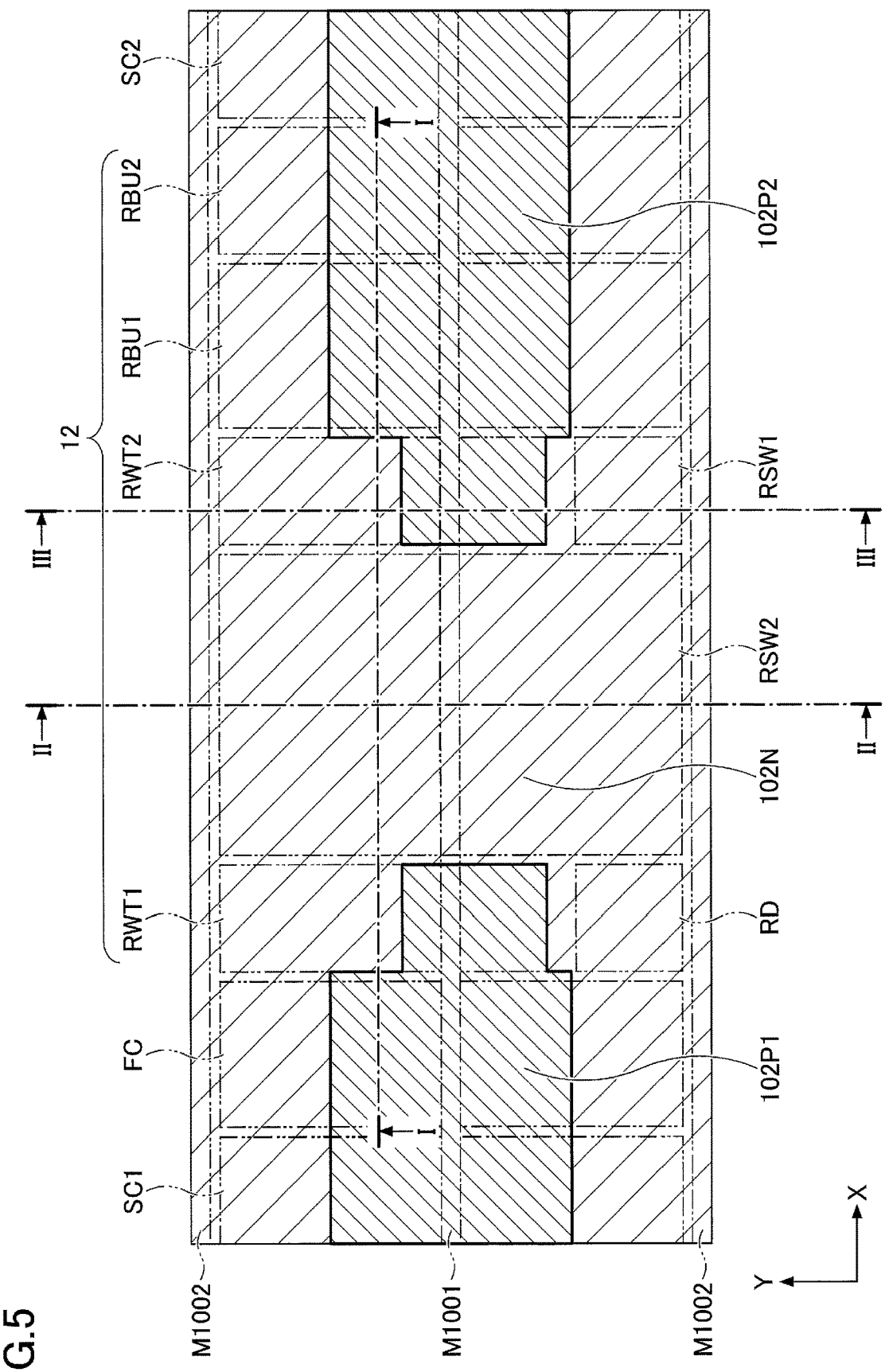
FIG. 5 is a diagram illustrating, in a plan view, an example of a configuration of a well according to the first embodiment.
Figure 6:
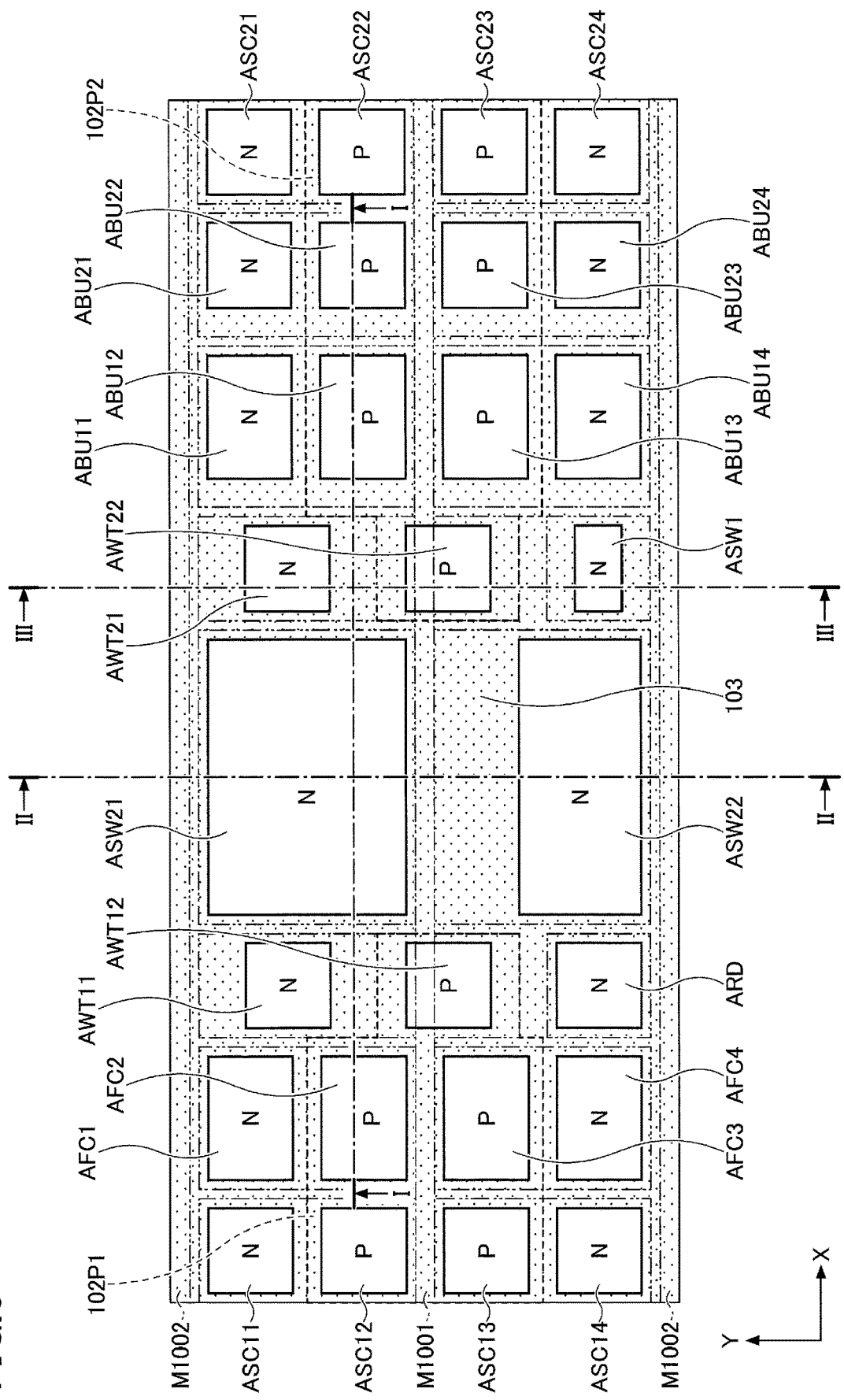
FIG. 6 is a diagram illustrating, in a plan view, an example of a relationship between an active region and an element isolation region according to the first embodiment.
Figure 7:
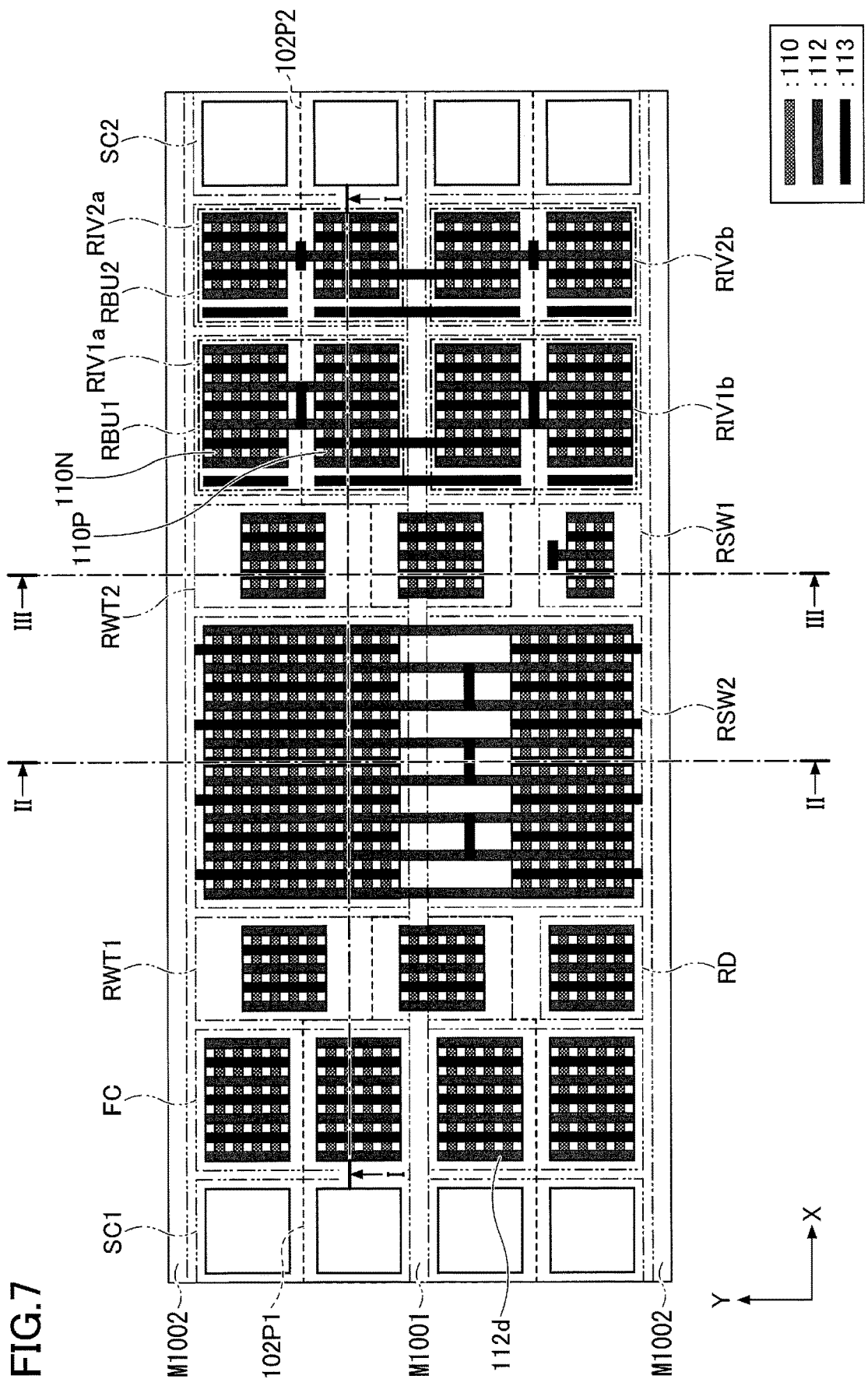
FIG. 7 is a diagram illustrating, in a plan view, an example of a configuration of fins, gate electrodes, and local interconnects according to the first embodiment.
Figure 8:
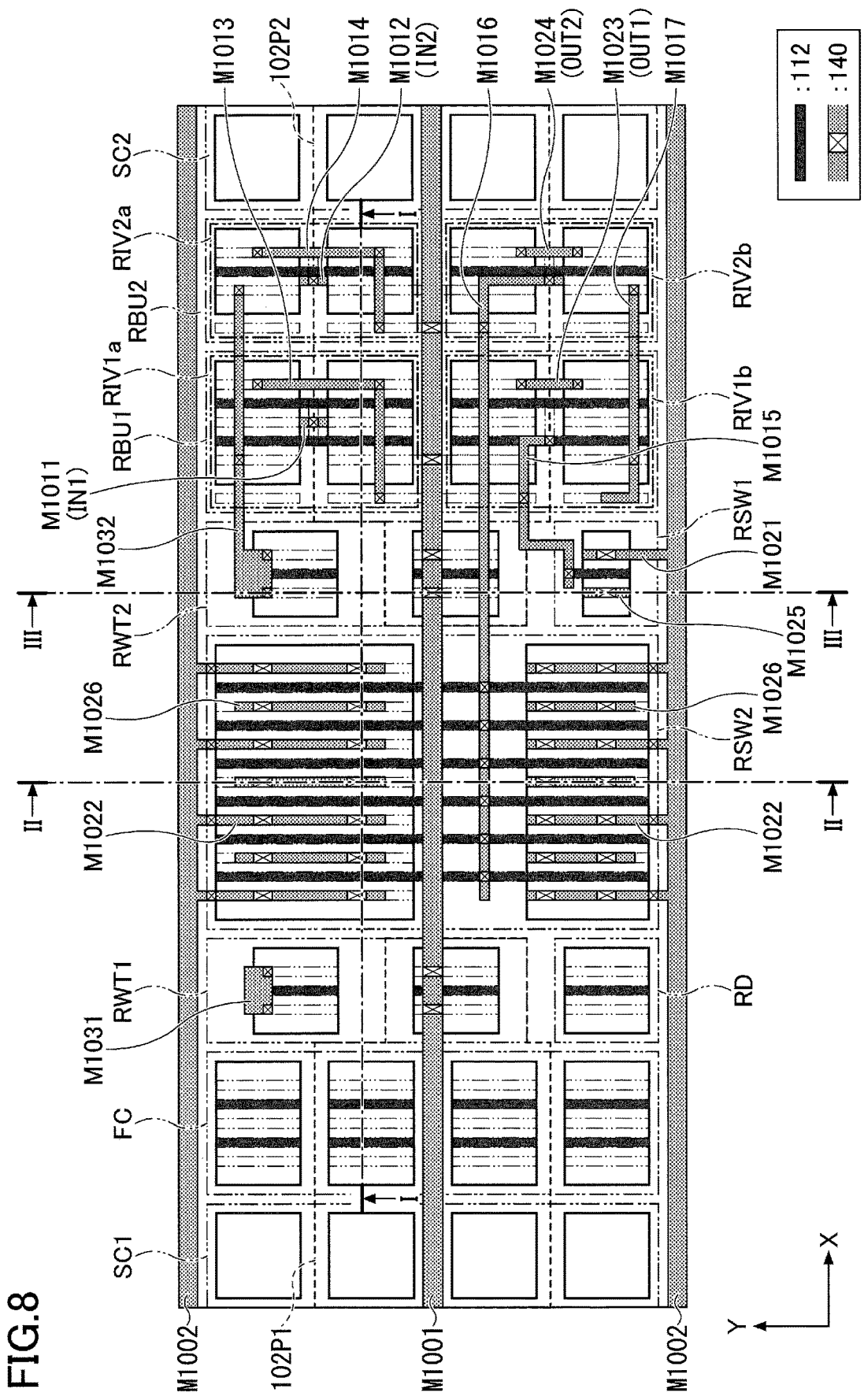
FIG. 8 is a diagram illustrating, in a plan view, an example of a relationship with respect to a first interconnect layer, the gate electrodes and the local interconnects according to the first embodiment.
Figure 9:
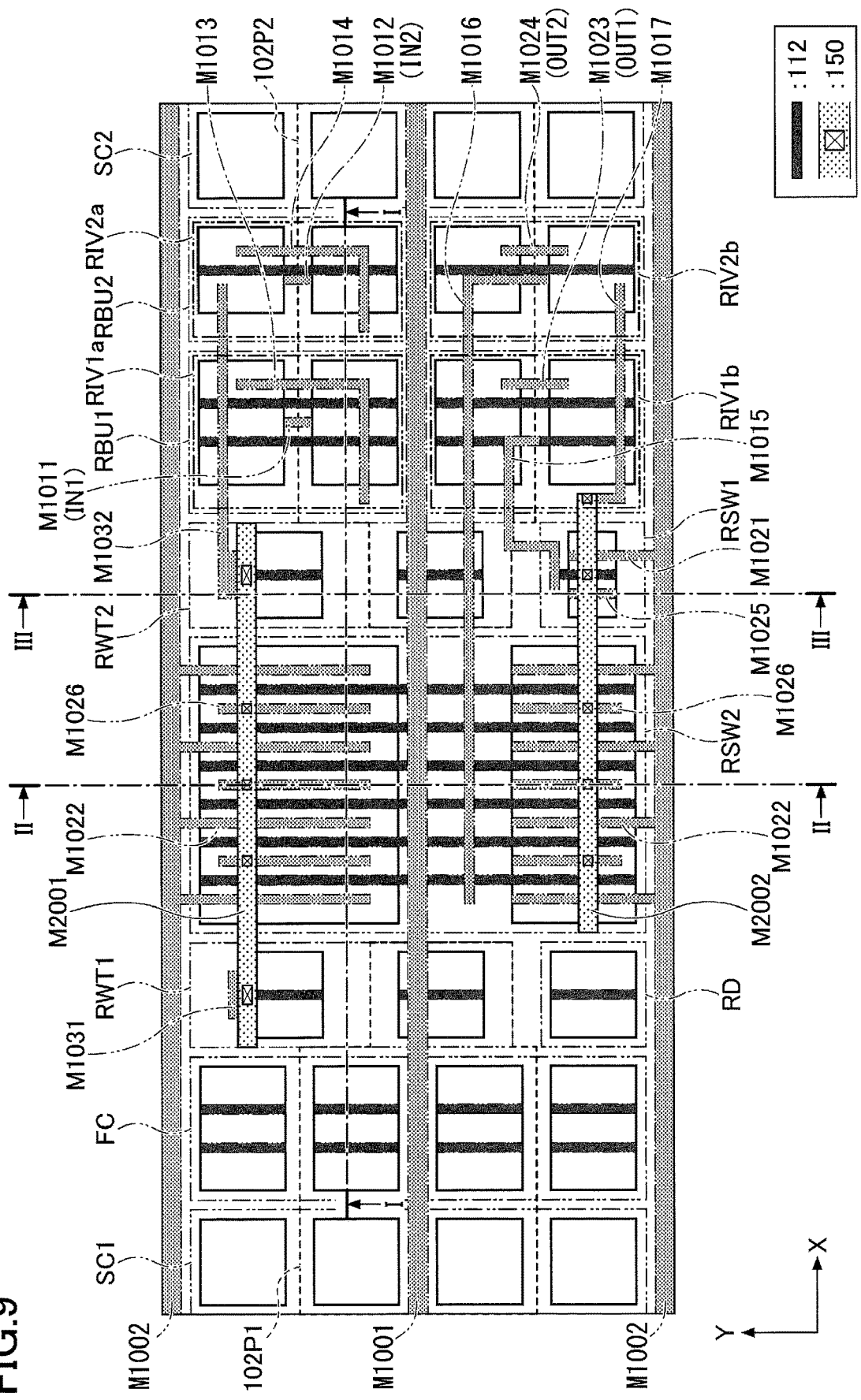
FIG. 9 is a diagram illustrating, in a plan view, an example of a relationship between a second interconnect layer and the first interconnect layer according to the first embodiment.
Figure 10:
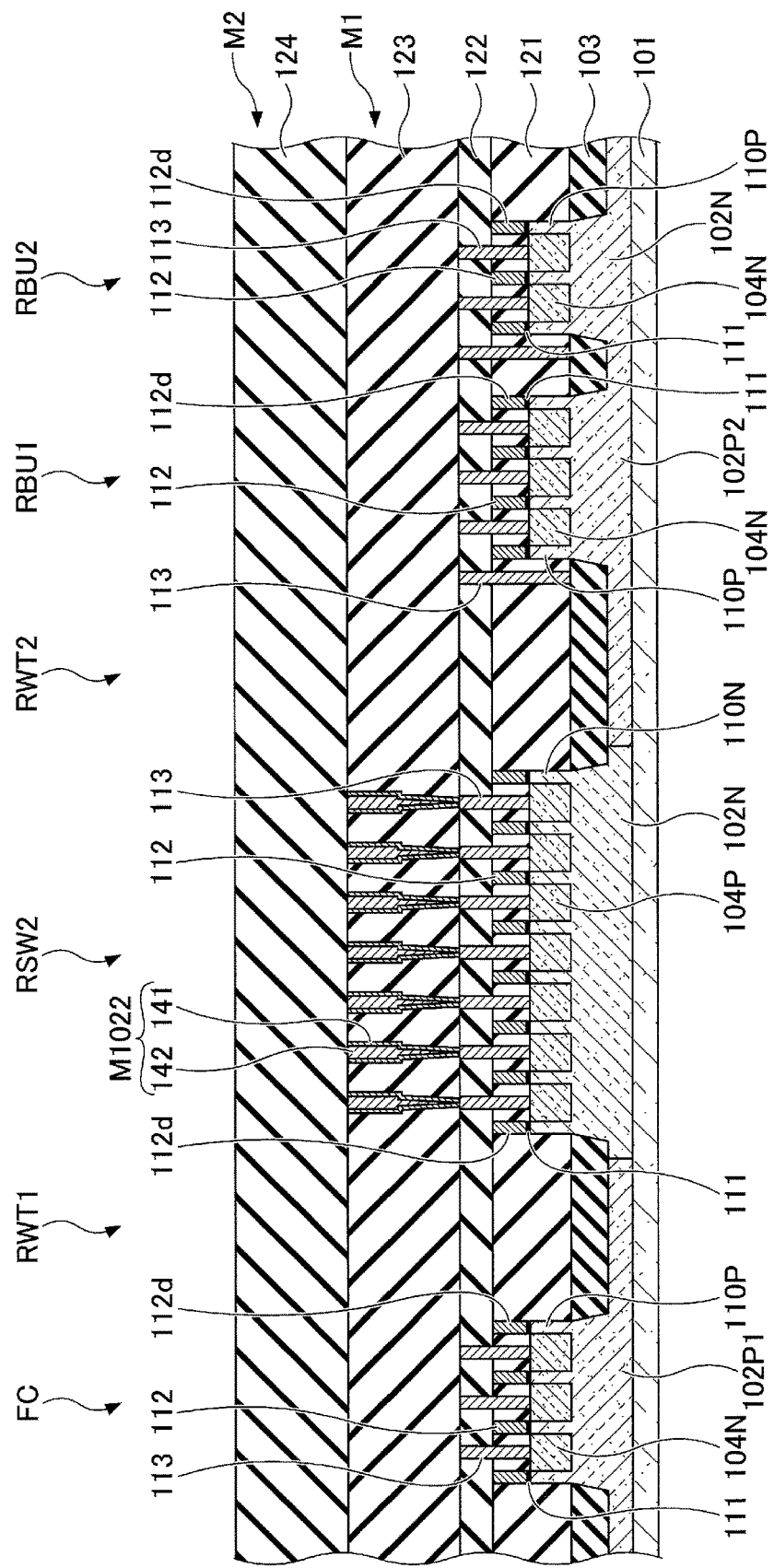
FIG. 10 is a cross-sectional view (part 1) illustrating an example of a configuration of the semiconductor device according to the first embodiment.
Figure 11:
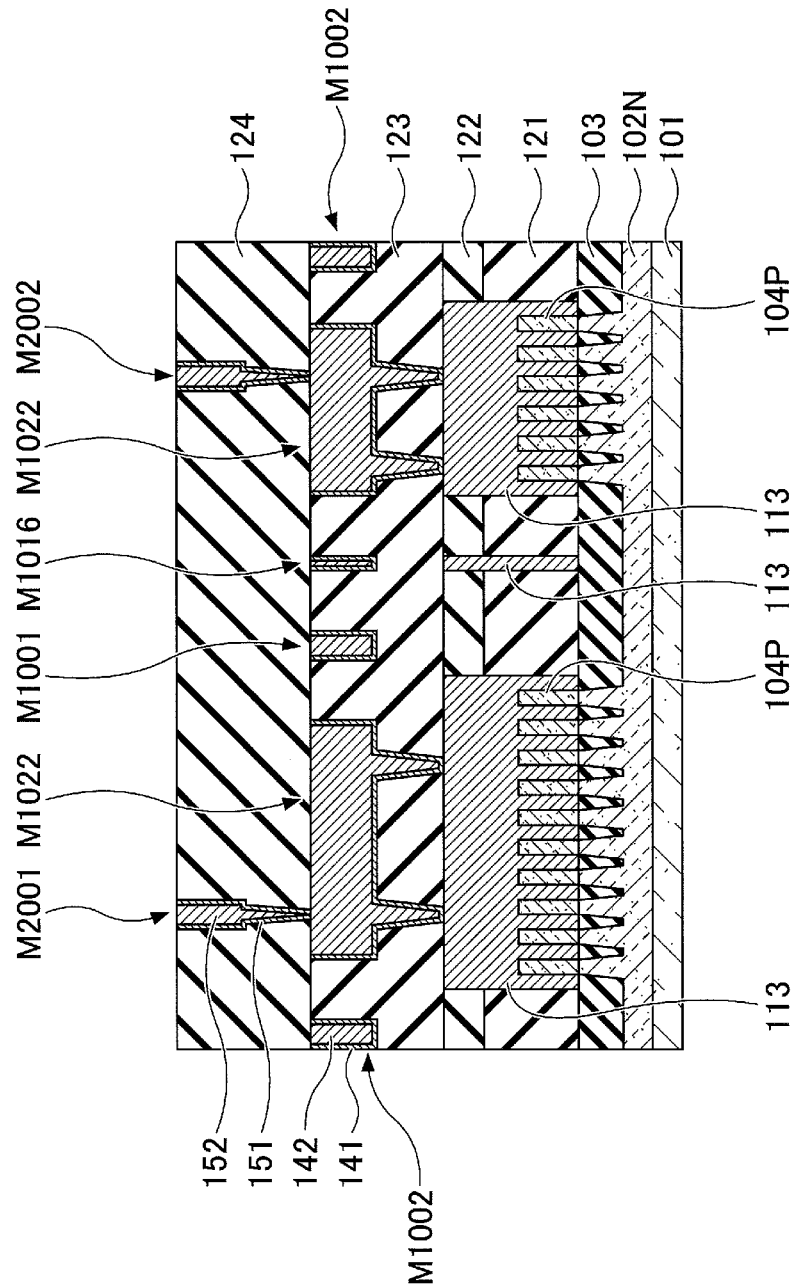
FIG. 11 is a cross-sectional view (part 2) illustrating an example of a configuration of the semiconductor device according to the first embodiment.
Figure 12:
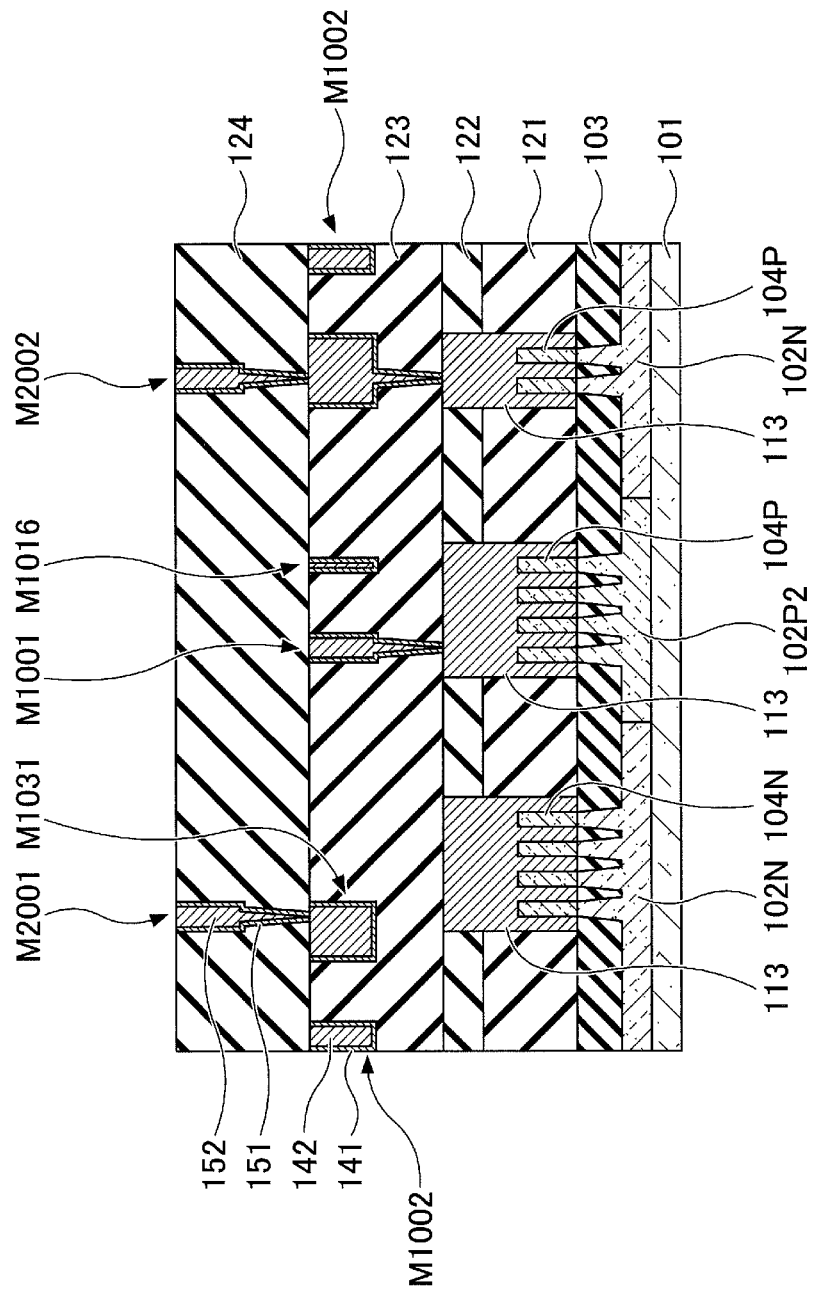
FIG. 12 is a cross-sectional view (part 3) illustrating an example of a configuration of the semiconductor device according to the first embodiment.

Hereafter, a layout of the standard cell 11 and the power switching circuit 12 is described. FIG. 5 is a diagram illustrating, in a plan view, an example of a configuration of a well according to the first embodiment. FIG. 6 is a diagram illustrating, in a plan view, an example of a relationship between active regions and an element isolation region according to the first embodiment. FIG. 7 is a diagram illustrating, in a plan view, an example of a configuration of fins, gate electrodes and local interconnects according to the first embodiment. FIG. 8 is a diagram illustrating, in a plan view, an example of a relationship with respect to a first interconnect layer, the gate electrodes and the local interconnects according to the first embodiment. FIG. 9 is a diagram illustrating, in a plan view, an example of a relationship between a second interconnect layer and the first interconnect layer according to the first embodiment. FIGS. 10 to 12 are cross-sectional views illustrating an example of a configuration of the semiconductor device according to the first embodiment. FIG. 10 is a cross-sectional view taken along line I-I in FIGS. 5 to 9. FIG. 11 is a cross-sectional view taken along line II-II in FIGS. 5 to 9. FIG. 12 is a cross-sectional view taken along line III-III in FIGS. 5 to 9. FIGS. 5 to 12 illustrate an area between two adjacent VVdd interconnects in the Y direction.

As illustrated in FIG. 5, etc., in the X direction, the power switching circuit 12 is disposed between standard cells SC1 and SC2. Also, a fill cell FC is disposed between the standard cell SC1 and the power switching circuit 12. The power switching circuit 12 includes a region RSW1 for a first switching transistor SW1, a region RSW2 for a second switching transistor SW2, a region RWT1 for a first well tap, and a region RWT2 for a second well tap. The power switching circuit 12 also includes a region RBU1 for a first buffer BU1, a region RBU2 for a second buffer BU2, and a region RD for a dummy cell. In the X direction, the region RBU2 adjoins the standard cell SC2, and the region RBU1 adjoins the region RBU2. In the X direction, the region RWT2 and the region RSW1 each adjoin the region RBU1, the region RSW2 adjoins the region RWT2 and the region RSW1, and the region RWT1 and the region RD each adjoin the region RSW2. In the Y direction, an interconnect M1001 used as the Vss interconnect is arranged in the middle of the two interconnects M1002 used as the respective VVdd interconnects. In the present embodiment, the standard cell SC2 is an example of a first standard cell, and the regions RSW1 and RSW2 are examples of a region for a first switching transistor. Also, the regions RBU1 and RBU2 are examples of a region for a first buffer, and the region RWT2 is an example of a region for a first well tap.

As illustrated in FIGS. 5 and 10, etc., on a surface of a semiconductor substrate 101, an N-well 102N, a P-well 102P1 and a P-well 102P2 are formed. The N-well 102N is formed under the interconnect M1001, between the P-well 102P1 and the P-well 102P2. The standard cell SC1, the fill cell FC and the region RWT1 are wholly formed in a region that is the N-well 102N and the P-well 102P1. The region RD, the region RSW2 and the region RSW1 are formed in the N-well 102N. The region RWT2, the region RBU1, the region RBU2 and the standard cell SC2 are wholly formed in a region that is the N-well 102N and the P-well 102P2. In such a manner, in the present embodiment, the P-well 102P1 is separated from the P-well 102P2, interposing the N-well 102N in a plan view.

As described in FIG. 6, etc., on the surface of the semiconductor substrate 101, an element isolation region 103 for defining an active region is formed. The element isolation region 103 is formed by a STI (shallow trench isolation) method, for example. In the present disclosure, the active region refers to a region defined by the element isolation region. In such an active region, a source, a drain and a channel with respect to each transistor are formed. For example, in the case of a planar transistor, in the active region, the surface of the semiconductor substrate 101 is exposed, protruding from the element isolation region. In the case of a fin transistor, a fin protruding from the element isolation region is formed in the active region. Note that the letter N or P represented in each active region of FIG. 6 indicates a conductivity type of a well in the corresponding active region.

The standard cell SC1 includes active regions ASC11, ASC12, ASC13 and ASC14. The active regions ASC11, ASC12, ASC13 and ASC14 are arranged in the Y direction, for example. The active regions ASC11 and ASC14 are disposed in the N-well 102N, and the active regions ASC12 and ASC13 are disposed in the P-well 102P1. Note that for example, in a case where the standard cell SC1 is a single height cell that includes the active regions ASC11 and ASC12, another standard cell may include the active regions ASC13 and ASC14.

The fill cell FC includes active regions AFC1, AFC2, AFC3 and AFC4. The active regions AFC1, AFC2, AFC3 and AFC4 are arranged in the Y direction, for example. The active regions AFC1 and AFC4 are disposed in the N-well 102N, and the active regions AFC2 and AFC3 are disposed in the P-well 102P1.

The region RWT1 for a well tap includes active regions AWT11 and AWT12. The active region AWT11 is disposed in the N-well 102N, and the active region AWT12 is disposed in the P-well 102P1.

The region RD for a dummy load cell includes an active region ARD. The active region ARD is disposed in the N-well 102N. The active regions AWT11 and AWT12 and the active region ARD are arranged in the Y direction, for example.

The region RSW2 for a switching transistor SW2 includes active regions ASW21 and ASW22. The active regions ASW21 and ASW22 are formed in the N-well 102N.

The region RSW1 for a switching transistor SW1 includes an active region ASW1. The active region ASW1 is formed in the N-well 102N.

The region RWT2 for a well tap includes active regions AWT2 and AWT22. The active region AWT21 is disposed in the N-well 102N, and the active region AWT22 is disposed in the P-well 102P2. The active regions AWT21 and AWT22 and the active region ASW1 are arranged in the Y direction, for example.

The region RBU1 for a buffer BU1 includes active regions ABU11, ABU12, ABU13 and ABU14. The active regions ABU11, ABU12, ABU13 and ABU14 are arranged in the Y direction, for example. The active regions ABU11 and ABU14 are disposed in the N-well 102N, and the active regions ABU12 and ABU13 are disposed in the P-well 102P2.

The region RBU2 for a buffer BU2 includes active regions ABU21, ABU22, ABU23 and ABU24. The active regions ABU21, ABU22, ABU23 and ABU24 are arranged in the Y direction, for example. The active regions ABU21 and ABU24 are disposed in the N-well 102N, and the active regions ABU22 and ABU23 are disposed in the P-well 102P2.

The standard cell SC2 includes active regions ASC21, ASC22, ASC23 and ASC24. The active regions ASC21, ASC22, ASC23 and ASC24 are arranged in the Y direction, for example. The active regions ASC21 and ASC 24 are disposed in the N-well 102N, and the active regions ASC22 and ASC 23 are disposed in the P-well 102P2. Note that for example, in a case where the standard cell SC2 is a single height cell that includes the active regions ASC21 and ASC22, another standard cell may include the active regions ASC23 and ASC24.

As illustrated in FIGS. 7 and 10, etc., in each active region, fins 110N or fins 110P protruding from the element isolation region 103 are formed. The fins 110N each constitute at least part of the N-well 102N. The fins 110P each constitute at least part of the P-well 102P. The fins 110N and the fins 110P extend in the X direction. Also, in each active region, gate electrodes 112 and dummy gate electrodes 112d that extend in the Y direction are formed. Gate insulator films 111 are each formed between a fin 110N and either of a gate electrode 112 or a dummy gate electrode 112d, as well as between a fin 110P and either of the gate electrode 112 or a dummy gate electrode 112d. Also, with respect to each fin 110N in which at least a transistor is formed, a source and a drain of a P-channel MOS transistor are formed in impurity regions 104P for P type impurity. With respect to each fin 110P in which at least a transistor is formed, a source and a drain of an N-channel MOS transistor are formed in impurity regions 104N for N type impurity. Local interconnects are formed over the impurity regions 104P or 104N. In such a manner, P-channel MOS transistor(s) or N-channel MOS transistor(s) are formed in each active region. Note that as illustrated in FIG. 12, in the active region AWT21, impurity regions 104N are formed in the fins 110N, and in the active region AWT22, impurity regions 104P are formed in the fins 110P. Also, in the active region AWT11, impurity regions 104N are formed in fins 110N, and in the active region AWT12, impurity regions 104P are formed in the fins 110P (not shown). In such a manner, with respect to the active regions relating to the regions RWT1 and RWT2 for a well tap, a conductive type of the impurity region where a given fin is formed is same as that of the well where a portion of the same fin is formed.

The gate electrodes 112 and local interconnects 113 are partially shared in the active regions. The region RBU1 includes a region RIV1a for an inverter IV1a and a region RIV1b for an inverter IV1b. In the region RIV1a, gate electrodes 112 are shared in the active regions ABU11 and ABU12. In the region RIV1b, gate electrodes 112 are shared in the active regions ABU13 and ABU14. Also, a local interconnect 113 that is connected to each source is shared in the active regions ABU12 and ABU13. The region RBU2 includes a region RIV2a for an inverter IV2a and a region RIV2b for an inverter IV2b. In the region RIV2a, a gate electrode 112 is shared in the active regions ABU21 and ABU22. In the region RIV2b, a gate electrode 112 is shared in the active regions ABU23 and ABU24. Also, a local interconnect 113 that is connected to each source is shared in the active regions ABU22 and ABU23.

A material of the local interconnect 113 includes tungsten, cobalt or ruthenium, for example. For the local interconnect 113, a base film that is formed of, e.g., titanium, titanium nitride, ruthenium or cobalt may be preferably formed. In a case where the local interconnect 113 is formed of cobalt or ruthenium, the base film may not be formed.

As illustrated in FIGS. 10 to 12, an interlayer insulation film 121 is formed to surround the fins 110N and 110P, as well as the gate electrodes 112 and the dummy gate electrodes 112d. The interlayer insulation film 121 and an interlayer insulation film 122 are formed to surround the local interconnects 113. Further, an interlayer insulation film 123 is formed on the interlayer insulation film 122, and a first interconnect layer M1 including various interconnects, as illustrated in FIG. 8, etc., is formed in the interlayer insulation film 123. Also, an interlayer insulation film 124 is formed on the interlayer insulation film 123, and a second interconnect layer M2 including various interconnects, as illustrated in FIG. 9, etc., is formed in the interlayer insulation film 124.

As illustrated in FIG. 8, etc., the first interconnect layer M1 includes the interconnect M1001 serving as the Vss interconnect, as well as including the interconnects M1002 serving as the respective VVdd interconnects. The interconnect M1001 is connected to each local interconnect 113 that is formed in the P-well P102P1, as well as each local interconnect 113 in the active region AWT22 that is formed in the P-well 102P2. The interconnect M1001 is also connected to each local interconnect 113 that is shared in the active regions ABU12 and ABU13 as well as each local interconnect 113 that is shared in the active regions ABU22 and ABU23. The interconnect M1002 is connected to an interconnect M1021 that is connected to a drain in the region RSW1 as well as an interconnect M1022 that is connected to a drain in the region RSW2. The first interconnect layer M1 includes an interconnect M1025 that is connected to a source in the region RSW1 as well as an interconnect M1026 that is connected to a source in the region RSW2.

The first interconnect layer M1 includes an interconnect M1011 connected to a gate in the region RIV1a, which constitutes an input section of the inverter IVa. The first interconnect layer M1 includes an interconnect M1012 connected to a gate in the region RIV2a, which constitutes an input section of the inverter IV2a. Also, the first interconnect layer M1 includes an interconnect M1013, which is connected to a drain in the active region ABU11 and a drain in the active region ABU12. The first interconnect layer M1 includes an interconnect M1014, which is connected to a drain in the active region ABU21 and a drain in the active region ABU22. The interconnect M1013 constitutes an output section of the inverter IV1a, and the interconnect M1014 constitutes an output section of the inverter IV2a.

The first interconnect layer M1 includes an interconnect M1015 connected to a gate in the region RIV1b, which constitutes an input section of the inverter IV1b. The first interconnect layer M1 includes an interconnect M1016 connected to a gate in a region RIV2b, which constitutes an input section of the inverter IV2b. Also, the first interconnect layer M1 includes an interconnect M1023, which is connected to a drain in the active region ABU13 and a drain in the active region ABU14. The first interconnect layer M1 includes an interconnect M1024, which is connected to a drain in the active region ABU23 and a drain in the active region ABU24. The interconnect M1023 constitutes an output section of the inverter IV1b, and the interconnect M1014 constitutes an output section of the inverter IV2b.

The interconnect M1013 and the interconnect M1015 are interconnected through part of local interconnects 113, and the interconnect M1014 and the interconnect M1016 are interconnected through part of local interconnects 113. The interconnect M1015 is also connected to a gate in the region RSW1, and the interconnect M1016 is also connected to a gate in the region RSW2.

The first interconnect layer M1 includes an interconnect M1031 that is connected to a source and a drain over the N-well 102N in the active region AWT11, and includes an interconnect M1032 that is connected to a source and a drain over the N-well 102N in the region RWT2. The interconnect M1032 is also connected to a source in the activity region ABU11 as well as a source in the activity region ABU21.

The first interconnect layer M1 includes an interconnect M1017, which is connected to a source in the active region ABU14 and a source in the active region ABU24.

The respective interconnects included in the first interconnect layer M1 are connected to the local interconnects 113 through a corresponding via 140. For example, the first interconnect layer M1 includes barrier metal films 141 and interconnect films 142. A material of the barrier metal film 141 includes, e.g., tantalum, tantalum nitride, titanium, ruthenium or cobalt, and a material of the interconnect film 142 includes, e.g., copper. For example, the first interconnect layer M1, including vias 140, is formed by a dual damascene method.

As illustrated in FIG. 9, etc., the second interconnect layer M2 includes interconnects M2001 and M2002 that each serve as the Vdd interconnect. The interconnect M2001 is connected to an interconnect M1031 in the active region AWT11 as well as an interconnect M1032 in the active region AWT21. The interconnect M2001 is also connected to an interconnect M1026 in the active region ASW21. The interconnect M2002 is connected to an interconnect M1025 in the active region ASW1, as well as an interconnect M1017 that is connected to a source in the active region ABU14 and a source in the active region ABU24. The interconnect M2002 is also connected to an interconnect M1026 in the active region ASW22.

The respective interconnects included in the second interconnect layer M2 are connected to interconnects included in the first interconnect layer M1 through a corresponding via 150. For example, the second interconnect layer M2 includes barrier metal films 151 and interconnect films 152. A material of the barrier metal film 151 includes, e.g., tantalum, tantalum nitride, titanium, ruthenium or cobalt, and a material of the interconnect film 152 includes, e.g., copper. For example, the second interconnect layer M2, including vias 150, is formed by a dual damascene method.

According to the first embodiment in such a manner, a power supply potential with respect to Vdd is supplied from the interconnects M2001 and M2002 to the N-well 102N through the active regions AWT11 and AWT21. Also, a ground potential with respect to Vss is supplied from the interconnect M1001 to the P-wells 102P1 and 102P2 through the active regions AWT12 and AWT22. The power supply potential with respect to Vdd and the ground potential with respect to Vss are also supplied to standard cells to which a given well is electrically connected, other than the regions in the X and Y directions as illustrated in FIGS. 5 to 12. In accordance with input signals IN1 and IN2, the interconnect M1002 is supplied with a power supply potential with respect to Wdd through the power switching circuit 12.

The interconnect M1002 is an example of a first interconnect, and the interconnects M2001 and M2002 are examples of a second interconnect.

In the present embodiment, in the Y direction, an arrangement of the active regions AWT 21 and AWT22 included in the region RWT2 for a well tap is different from that of the active regions ASC21 to ASC24 included in the standard cell SC2. Specifically, in the Y direction, with respect to the active regions ASC 21 to ASC24, their edge positions are each different from the edge positions of the active regions AWT21 and AWT22. Also, in the Y direction, with respect to the active regions ASC21 to ASC24, their sizes may be each different from the sizes of the active regions AWT21 and AWT22. Now, the regions RBU1 and RBU2 for a buffer are disposed between the region RWT2 and the standard cell SC2. In the Y direction, the arrangements of the active regions ASC 21 to ASC24 match the respective arrangements of the active regions ABU11 to ABU14, and match the respective arrangements of the active regions ABU21 to ABU24. In other words, in terms of both a position and a size in the Y direction, the active regions ASC21 to ASC24 respectively match the active regions ABU11 to ABU14, and respectively match the active regions ABU21 to ABU24. For example, in the Y direction, the arrangements of the fins in the active regions ASC21 to ASC24 match the respective arrangements of the fins in the active regions ABU11 to ABU14, and match the respective arrangements of the fins in the active regions ABU21 to ABU24. Thereby, in the first embodiment, transistors in the standard cell SC2 are not easily affected by a difference in arrangement of the active regions between the standard cell SC2 and the region RWT2.

For this reason, according to the first embodiment, variations of electrical characteristics of the standard cell SC2 can be suppressed.

Also, transistors formed in the regions RBU1 and RBU2 for a buffer are flexibly designed, compared to the transistors formed in the standard cell SC2. For example, in a case where a same standard cell is designed, no matter where it is situated in the standard cell region 1, the standard cell may be expected to have its characteristics within a desired range. However, such a standard cell is not easily designed in consideration of variations of electrical characteristics of the standard cell, affected by a distance between the power switching circuit 12 and the standard cell. In contrast, buffers included in the power switching circuit 12 can be designed in a buffer-specific manner. In this case, transistors in the regions RBU1 and RBU2 for a buffer can be designed in consideration of an effect affected by the region RWT2 for a well tap, on account of the region RWT2 differing from the standard cell in terms of an arrangement of the active regions in the region RWT2 and the standard cell. Accordingly, transistors in the regions RBU1 and RBU2 for a buffer can be preliminarily designed in consideration of an effect affected by the region RWT2.

Note that in the present disclosure, a match between the arrangement of regions does not mean a perfect match to the extent of not allowing for manufacturing variations. For example, even when there are manufacturing variations in the arrangements, the arrangements are considered as matching. This consideration also applies to other embodiments.

Also, the number of fins with respect to each of the active regions ABU11 to ABU14 may not be respectively same as that with respect to each of the active regions ABU21 to ABU24. For example, part of the fins in a certain active region may be removed without removing the fins in another active region in a case where the arrangements of these active regions defined by the element isolation region match. The number of fins in an active region is not limited to a specific number, and may be an even number or an odd number, for example.

The power switching circuit 12 is not limited to a double height cell, and may be a single height cell disposed between an adjacent Vss interconnect and VVdd interconnect. The power switching circuit 12 may be a multi-height cell that has three or more heights in size in the Y direction.

Similarly, the standard cell 11 may be a single height cell or a multi-height cell. In a case where the power switching circuit 12 is, for example, a single height cell, in the buffer BU2 that contacts with the standard cell SC2, the inverters 2a and 2b may be disposed in the respective active regions ABU21 and ABU22.

In a case where the region RWT1 for a well tap covers the region RD for a dummy cell, the interconnect M2002 may be connected to a source and a drain in the active region ARD through the first interconnect layer M1, and thus this active region may be used as a well tap for an N-well. In this case, the impurity regions formed in the fins 110N in the active region ARD are of an N conductivity type.

In the present embodiment, the second buffer BU2 is disposed to adjoin the standard cell SC2, but the positions of the first buffer BU1 and the second buffer BU2 may be reversed. Specifically, in a plan view, the first buffer BU1 may be disposed to adjoin the second standard cell SC2, between the second buffer BU2 and the standard cell SC2.

Second Embodiment

Figure 13:
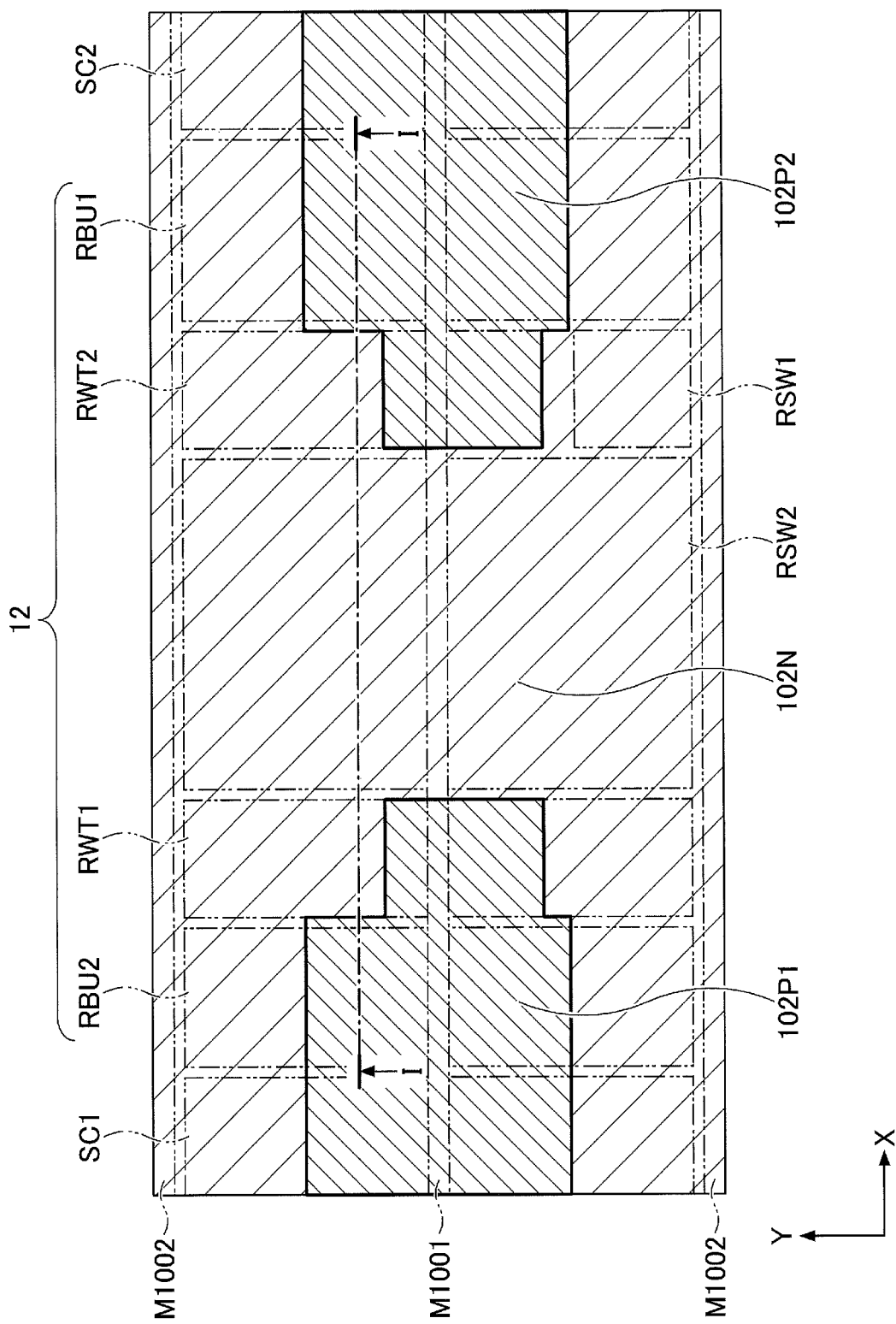
FIG. 13 is a diagram illustrating, in a plan view, an example of a configuration of a well according to a second embodiment.
Figure 14:
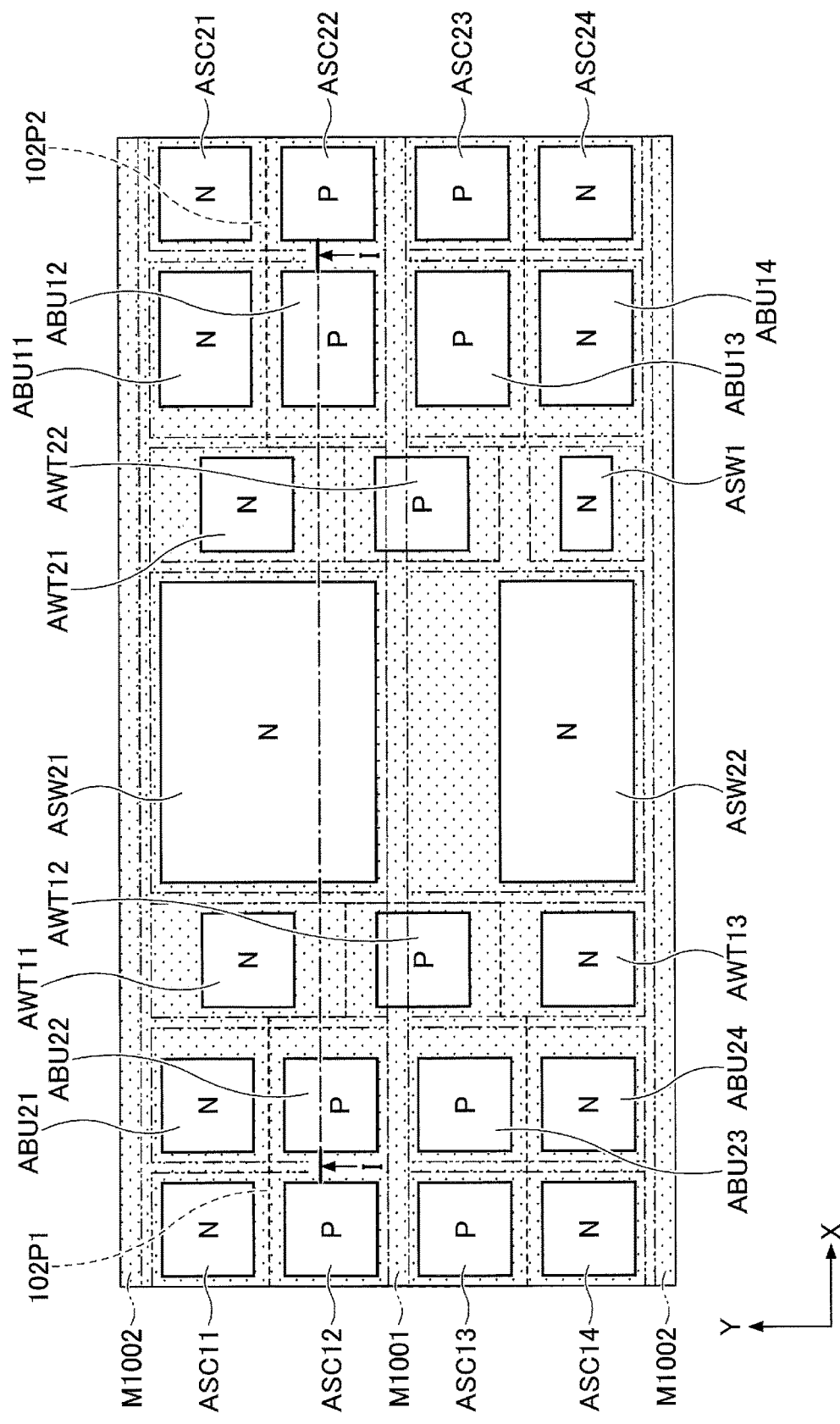
FIG. 14 is a diagram illustrating, in a plan view, an example of a relationship between active regions and an element isolation region according to the second embodiment.
Figure 15:
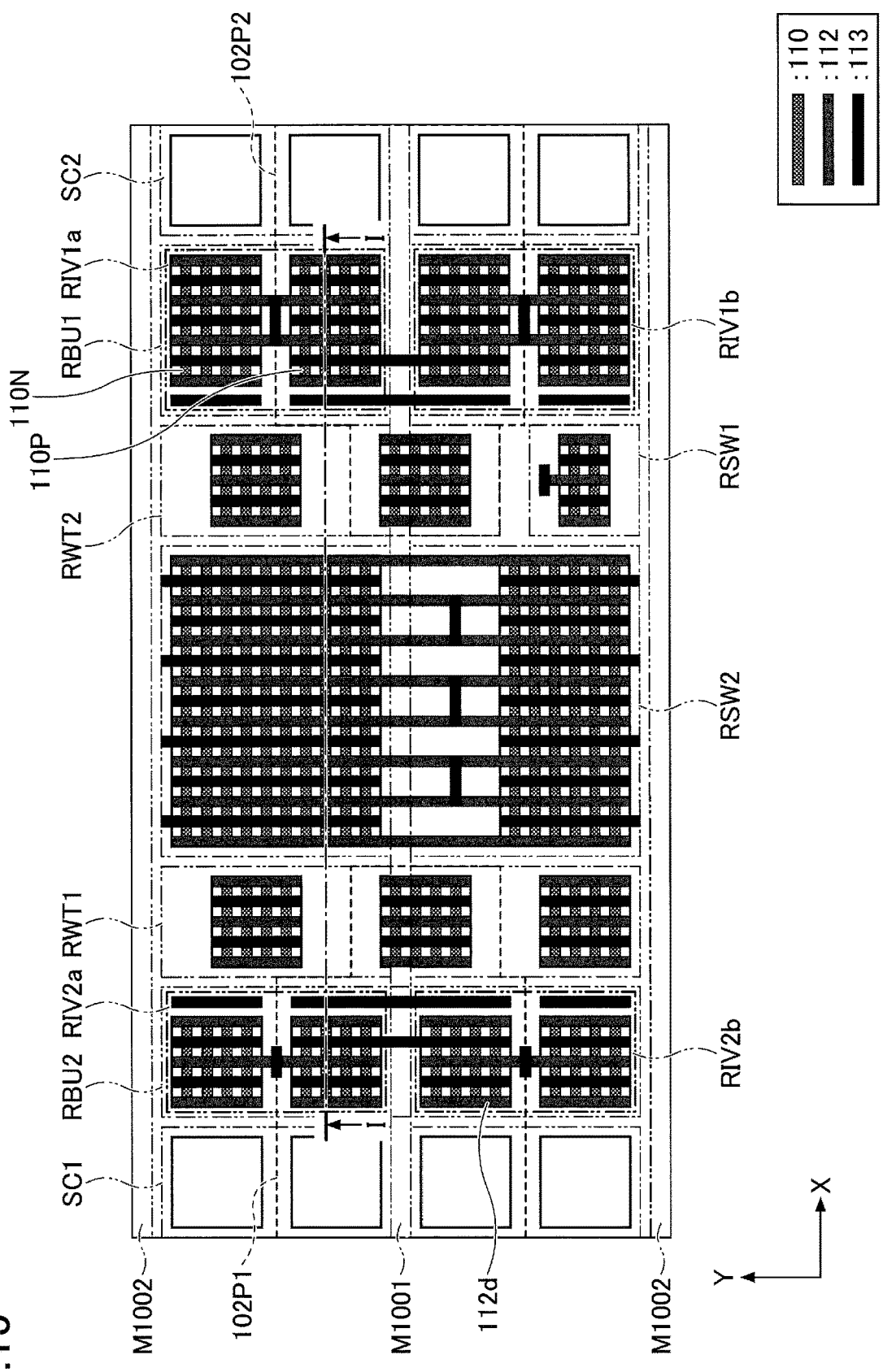
FIG. 15 is a diagram illustrating, in a plan view, an example of a configuration of fins, gate electrodes and local interconnects according to the second embodiment.
Figure 16:
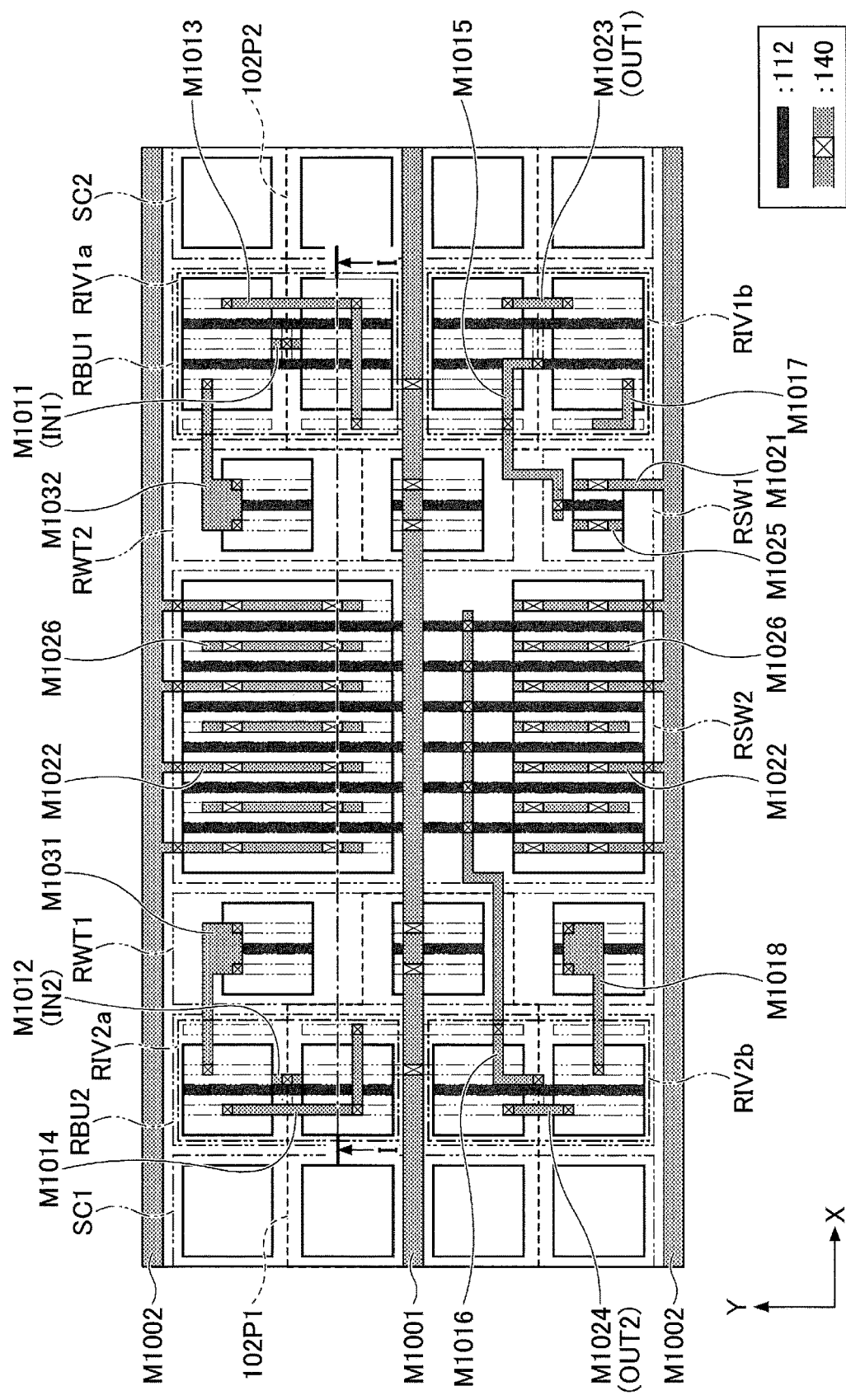
FIG. 16 is a diagram illustrating, in a plan view, an example of a relationship with respect to a first interconnect layer, the gate electrodes and the local interconnects according to the second embodiment.
Figure 17:
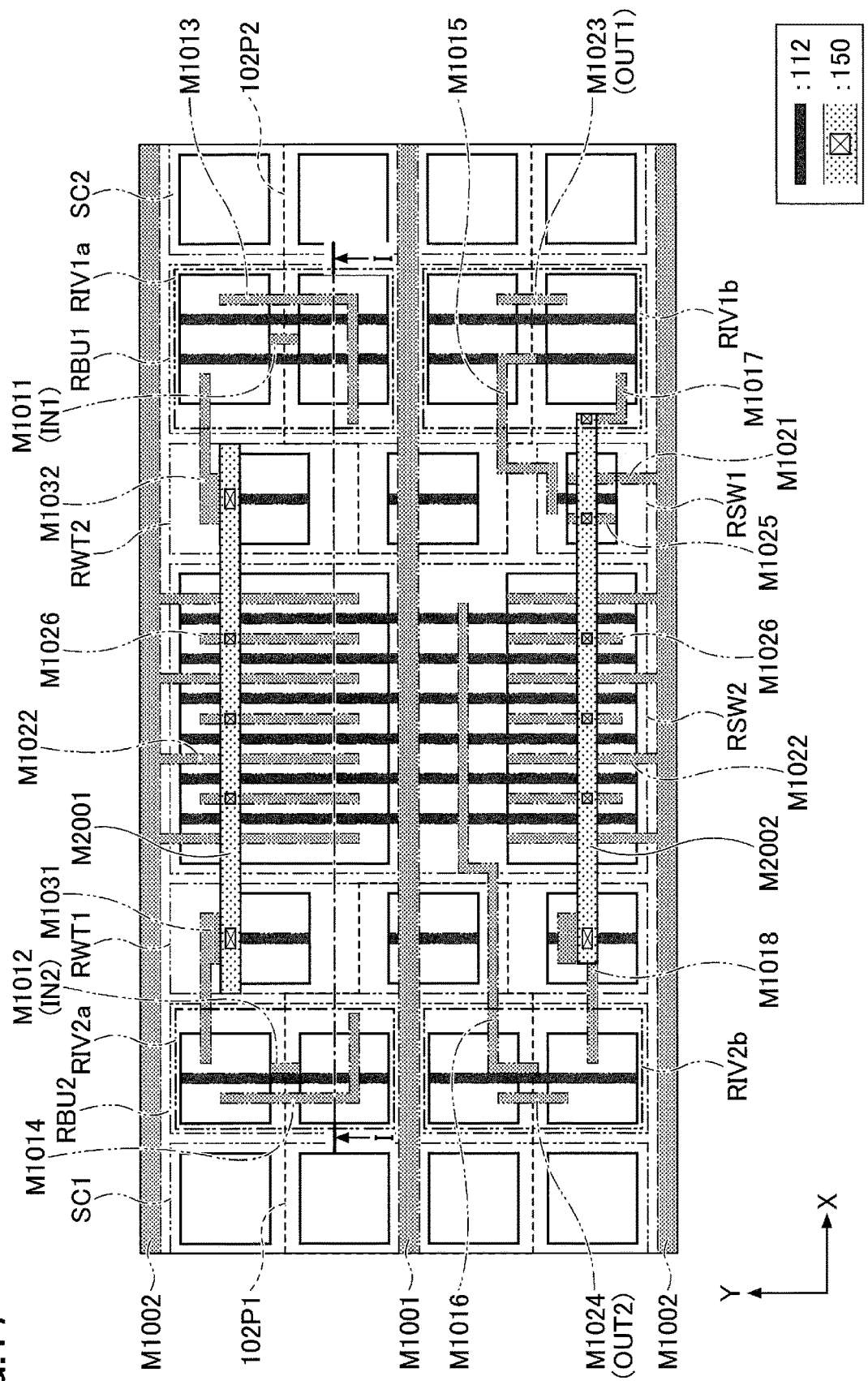
FIG. 17 is a diagram illustrating, in a plan view, an example of a relationship between a second interconnect layer and the first interconnect layer according to the second embodiment.
Figure 18:
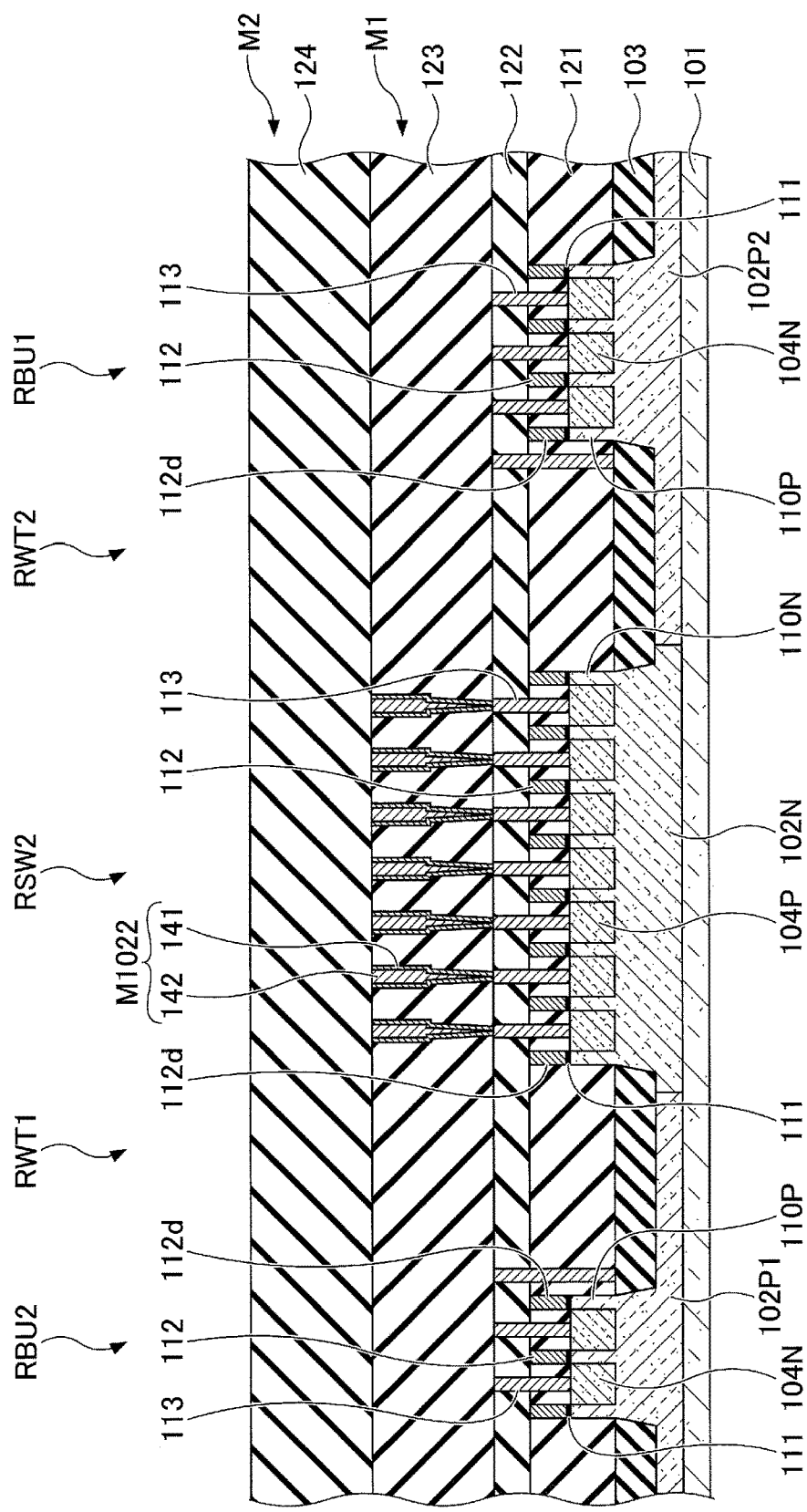
FIG. 18 is a cross-sectional view illustrating an example of a configuration of a semiconductor device according to the second embodiment.

A second embodiment is described hereafter. The second embodiment differs from the first embodiment in terms of the arrangement of the region RBU2 for a buffer BU2. FIG. 13 is a diagram illustrating, in a plan view, an example of a configuration of a well according to the second embodiment. FIG. 14 is a diagram illustrating, in a plan view, an example of a relationship between active regions and an element isolation region according to the second embodiment. FIG. 15 is a diagram illustrating, in a plan view, an example of a configuration of fins, gate electrodes and local interconnects according to the second embodiment. FIG. 16 is a diagram illustrating, in a plan view, an example of a relationship with respect to a first interconnect layer, the gate electrodes and the local interconnects according to the second embodiment. FIG. 17 is a diagram illustrating, in a plan view, an example of a relationship between a second interconnect layer and the first interconnect layer according to the second embodiment. FIG. 18 is a cross-sectional view illustrating an example of a configuration of a semiconductor device according to the second embodiment. FIG. 18 is a cross-sectional view taken along line I-I in FIGS. 13 to 17. FIGS. 13 to 18 illustrate an area between two adjacent VVdd interconnects in the Y direction.

As illustrated in FIGS. 13 to 18, a power switching circuit 12 is disposed in an X direction, between standard cells SC1 and SC2. The power switching circuit 12 includes a region RSW1 for a switching transistor SW1, a region RSW2 for a switching transistor SW2, a region RWT1 for a first well tap, a region RWT2 for a second well tap, a region RBU1 for a first buffer BU1, and a region RBU2 for a second buffer BU2. In a plan view, the region RBU1 adjoins the standard cell SC2, the region RWT2 and the region RSW1 each adjoin the region RBU1, and the region RSW2 adjoins the region RWT2 and the region RSW1. In a plan view, the region RWT1 adjoins the region RSW2, and the region RBU2 adjoins the region RWT1. The region RWT1 covers the region RD for a dummy cell in the first embodiment. In a plan view, an interconnect M1001 used as a Vss interconnect is disposed between two interconnects M1002 used as the respective VVdd interconnects.

The region RWT1 for a well tap includes active regions AWT11, AWT12 and AWT13. The active region AWT13 is disposed in an N-well 102N, as in the case of the active region ARD.

In the second embodiment, an interconnect M2002 that constitutes the Vdd interconnect is electrically connected to a source in an active region ABU14 through an interconnect M1017. The interconnect M2002 is also electrically connected to a source in an active region ABU24 through an interconnect M1018. Further, an interconnect M2001 that constitutes the Vdd interconnect is electrically connected to a source in an active region ABU11 through an interconnect M1032. The interconnect M2001 is also electrically connected to a source in an active region ABU21 through an interconnect M1031. The interconnect M1018 is also electrically connected to an N type impurity region that is formed over an N-well 102N in the active region AWT13. Also, the interconnect M1031 is electrically connected to an N type impurity region that is formed over the N-well 102N in the active region AWT11. Note that instead of the active region AWT13, the active region ARD used as a dummy may be disposed, as in the case of the first embodiment.

The interconnect M2002 is also connected to the interconnect M1018 in the active region AWT13, in addition to the interconnects M1025, M1026 and M1017.

In the present embodiment, the standard cell SC1 is an example of a second standard cell, and the standard cell SC2 is an example of a first standard cell. The region RSW1 is an example of a region for a first switching transistor, and the region RSW2 is an example of a region for a second switching transistor. Also, the region RBU1 is an example of a region for a first buffer, and the region RBU2 is an example of a region for a second buffer. The region RWT1 is an example of a region for a second well tap, and the region RWT2 is an example of a region for a first well tap. The interconnects M1002 are examples of a first interconnect, and the interconnects M2001 and M2002 are examples of a second interconnect.

Other configurations are same as the first embodiment.

According to the second embodiment in such a manner, a potential with respect to Vdd is supplied from the interconnects M2001 and M2002 to the N-well 102N through the active regions AWT11, AWT13 and AWT21. Also, a potential with respect to Vss is supplied from the interconnect M1001 to the P-wells 102P1 and 102P2 through the active regions AWT12 and AWT22. The power supply potential with respect to Vdd and the ground potential with respect to Vss are also supplied to each standard cell to which a given well is electrically connected, other than the regions in the X and Y directions as illustrated in FIGS. 13 to 18. In accordance with input signals IN1 and IN2, the interconnect M1002 is supplied with a power supply potential with respect to VVdd through the power switching circuit 12.

The second embodiment can have a similar effect to the first embodiment as well. In the second embodiment, without disposing the fill cell FC, the region RBU2 for a buffer is disposed between the region RWT1 and the standard cell SC1. In the Y direction, the respective arrangements of the active regions ABU 21 to ABU24 match the arrangements of the active regions ASC11 to ASC14. In other words, in the Y direction, with regards to the active regions ABU 21 to ABU24, their respective positions and sizes match the positions and sizes with respect to the active regions ASC11 to ASC14. For example, in the Y direction, the respective arrangements of the fins in the active regions ABU21 to ABU24 match the arrangements of the fins in the active regions ASC11 to ASC14. Accordingly, in the second embodiment, without disposing the fill cell FC, transistors in the standard cell SC1 are not easily affected by a difference in the arrangement between the active region RWT1 and the standard cell SC.

Further, the region RBU1 for a buffer is disposed between the region RWT2 and the standard cell SC2. In the Y direction, the respective arrangements of the active regions ASC21 to ASC24 match the arrangements of the active regions ABU11 to ABU14. In other words, in the Y direction, with regards to the active regions ASC21 to ASC24, their respective positions and sizes match the positions and sizes with respect to the active regions ABU11 to ABU14. For example, in the Y direction, the respective arrangements of the fins in the respective active regions ASC21 to ASC24 match the arrangements of the fins in the active regions ABU11 to ABU14. Accordingly, as in the case of the first embodiment, transistors in the standard cell SC2 are not easily affected by a difference in the arrangement between the active region RWT1 and the standard cell SC2, thereby suppressing variations of electrical characteristics of the standard cell SC2, as in the case of the first embodiment.

In view of the above, the second embodiment can suppress variations of electrical characteristics of the standard cells SC1 and SC2 along with decreasing the area, compared to the first embodiment.

Third Embodiment

Figure 19:
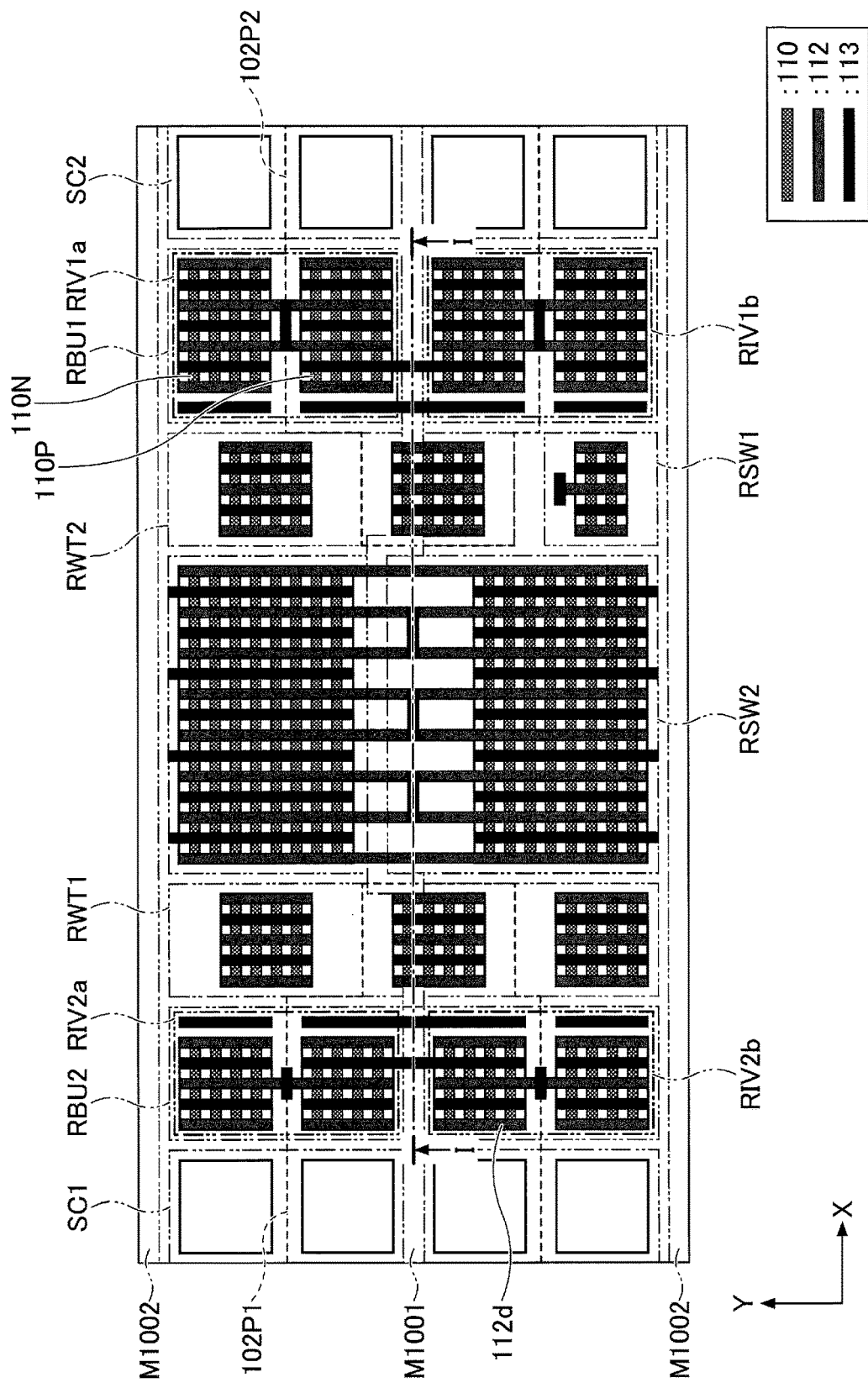
FIG. 19 is a diagram illustrating, in a plan view, an example of a configuration of fins, gate electrodes, and local interconnects according to a third embodiment.
Figure 20:
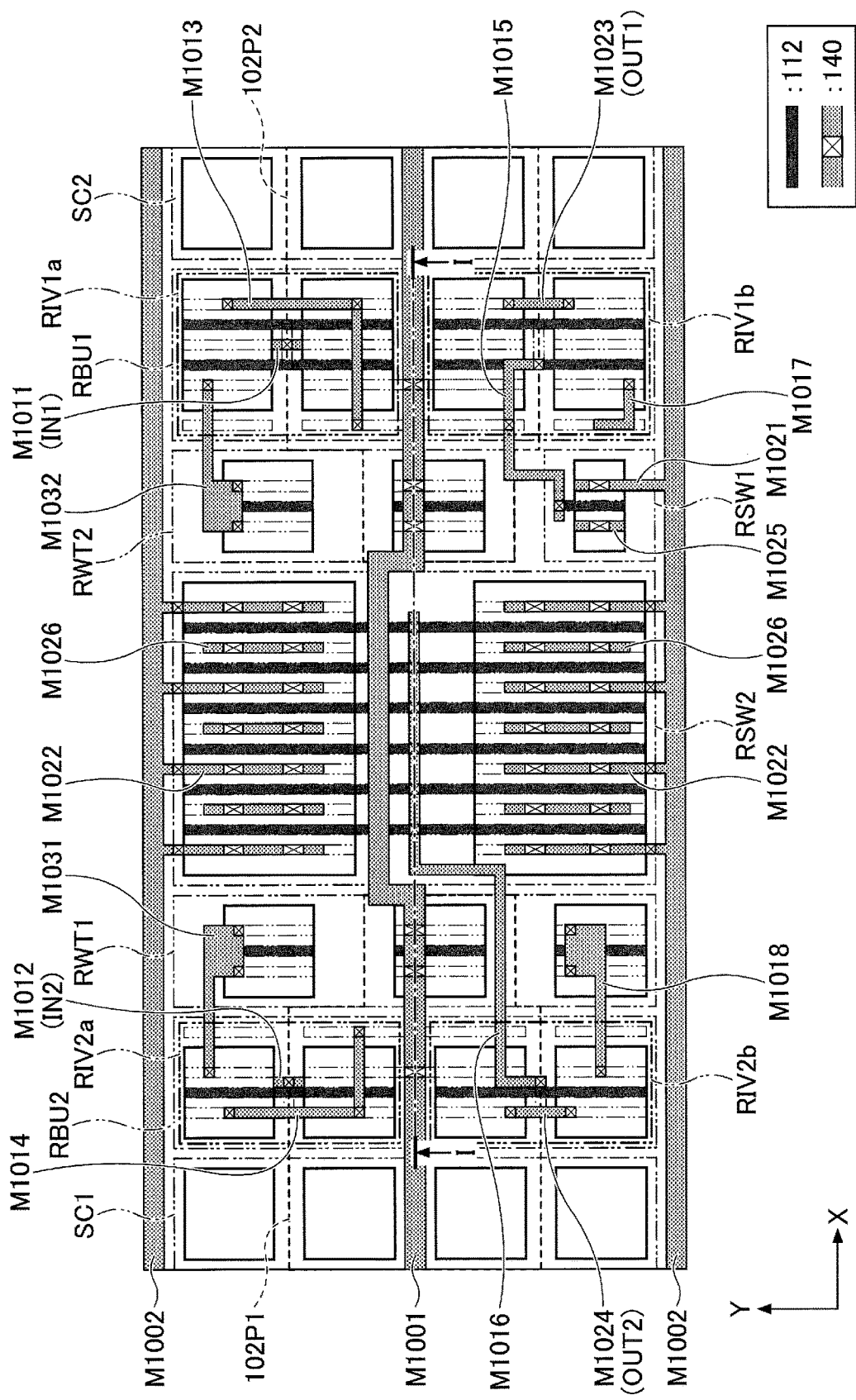
FIG. 20 is a diagram illustrating, in a plan view, an example of a relationship with respect to a first interconnect layer, the gate electrodes and the local interconnects according to the third embodiment.
Figure 21:
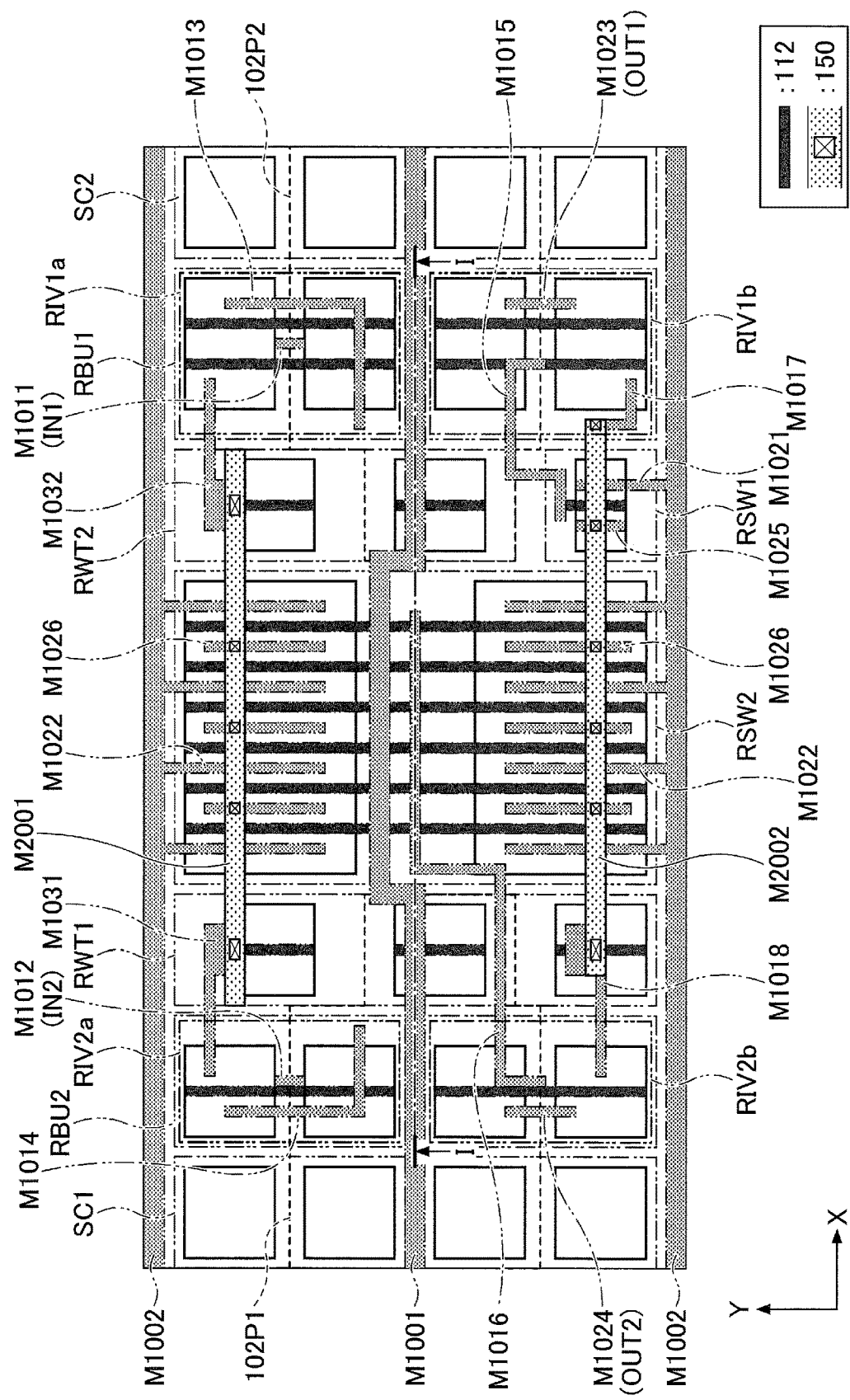
FIG. 21 is a diagram illustrating, in a plan view, an example of a relationship between a second interconnect layer and the first interconnect layer according to the third embodiment.
Figure 22:
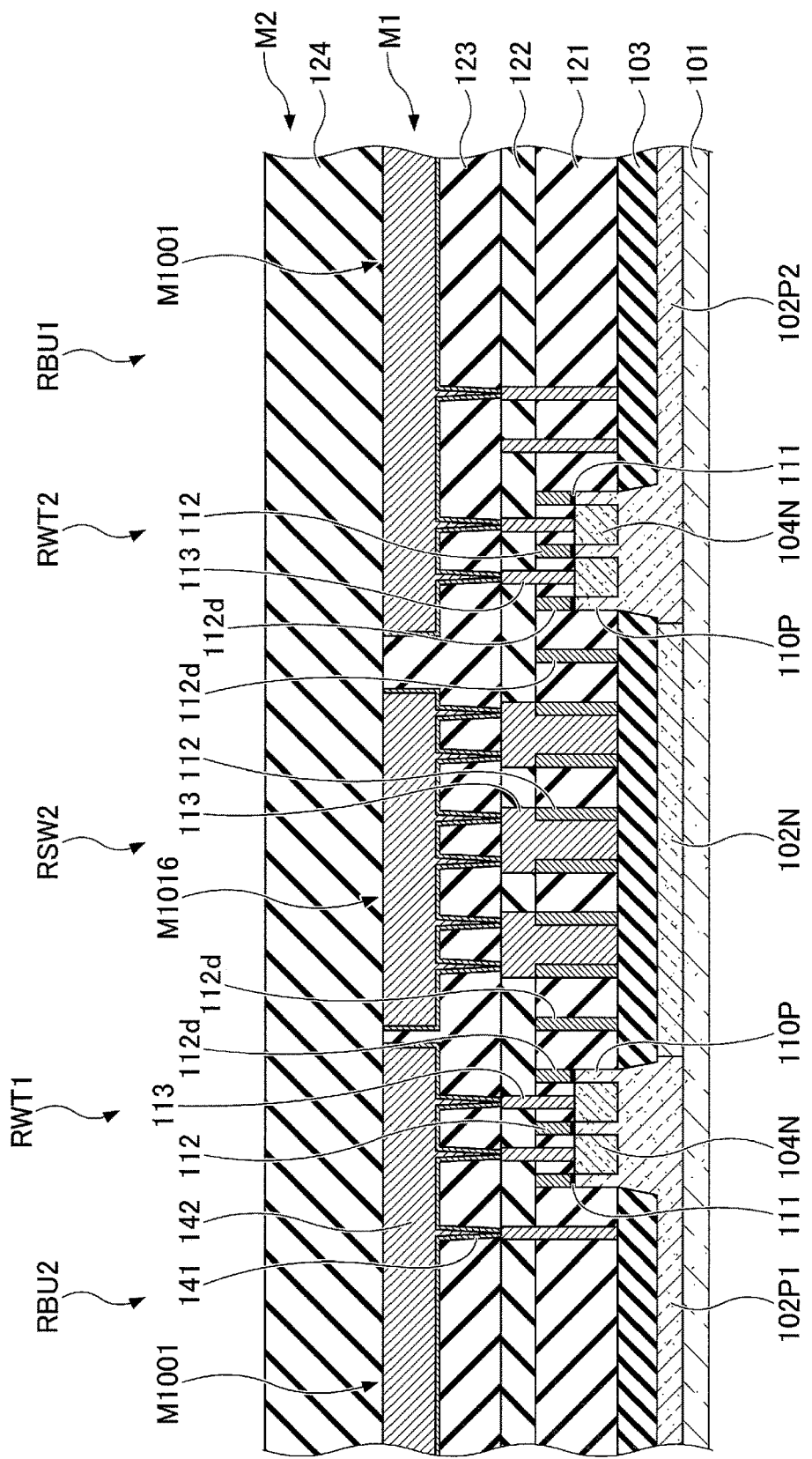
FIG. 22 is a cross-sectional view illustrating an example of a configuration of a semiconductor device according to the third embodiment.

A third embodiment is described hereafter. The third embodiment differs from the second embodiment in terms of the arrangement of the active regions ASW21 and ASW22 included in the region RSW2. FIG. 19 is a diagram illustrating, in a plan view, an example of a configuration of fins, gate electrodes and local interconnects according to the third embodiment. FIG. 20 is a diagram illustrating, in a plan view, an example of a relationship with respect to a first interconnect layer, the gate electrodes and the local interconnects according to the third embodiment. FIG. 21 is a diagram illustrating, in a plan view, an example of a relationship between a second interconnect layer and the first interconnect layer according to the third embodiment. FIG. 22 is a cross-sectional view illustrating an example of a configuration of a semiconductor device according to the third embodiment. FIG. 22 is a cross-sectional view taken along line I-I in FIGS. 19 to 21. FIGS. 19 to 21 illustrate an area between two adjacent Wdd interconnects in the Y direction.

As illustrated in FIGS. 19 to 22, in the third embodiment, an interconnect M1016 connected to a gate in a region RSW2 is positioned in the middle between two interconnects M1002 in a Y direction. In the Y direction, a size of an active region ASW21 matches a size of an active region ASW22. In other words, in a plan view, a portion of the interconnect M1016 that overlaps a gate in the region RSW2 is situated between active regions ASW21 and ASW22. In such a manner, a portion of an interconnect M1001 bypasses, in a plan view, the middle between the interconnects M1002 so as to be situated in the active region ASW21. Specifically, the interconnect M1001 includes two portions, which are bent so as to be situated in the active region ASW21 and extend in the Y direction, and includes a portion that is connected to the two portions and that extends in an X direction. In a plan view, the portion that extends in the X direction is displaced in the Y direction with respect to a position of the interconnect M1001 in an area where a power switching circuit 12 is not situated. For example, in a plan view, a portion of the interconnect M1016 extends in the X direction, at the same direction as the Y direction position of the interconnect M1001 in the region where the interconnect M1001 does not overlap the power switching circuit 12, and is situated between the two portions of the interconnect M1001 that extend in the Y direction. Note that in the region RSW2, the above bypass portion of the interconnect M1001 may be situated, in a plan view, between the active region ASW21 and the interconnect M1016. Alternatively, such a bypass portion may be situated so as to overlap the active region ASW21 in a plan view.

Other configurations are same as the second embodiment. Note that the interconnects M1016 and M1001 in the present embodiment may apply to the first embodiment.

The third embodiment can have a similar effect to the second embodiment. In the third embodiment, in the X and Y directions, the size of the active region ASW 21 matches the size of the active region ASW 22. In such a manner, the number of fins in the active region ASW21 is same as that in the active region ASW22, and thus the number of transistors in the active region ASW21 is same as that in the active region ASW22. Thereby, a potential Vdd is equally supplied through the interconnects 1002. Note that, in a case where there are manufacturing variations in the sizes, the sizes are considered as matching. This consideration also applies to other embodiments.

Fourth Embodiment

Figure 23:
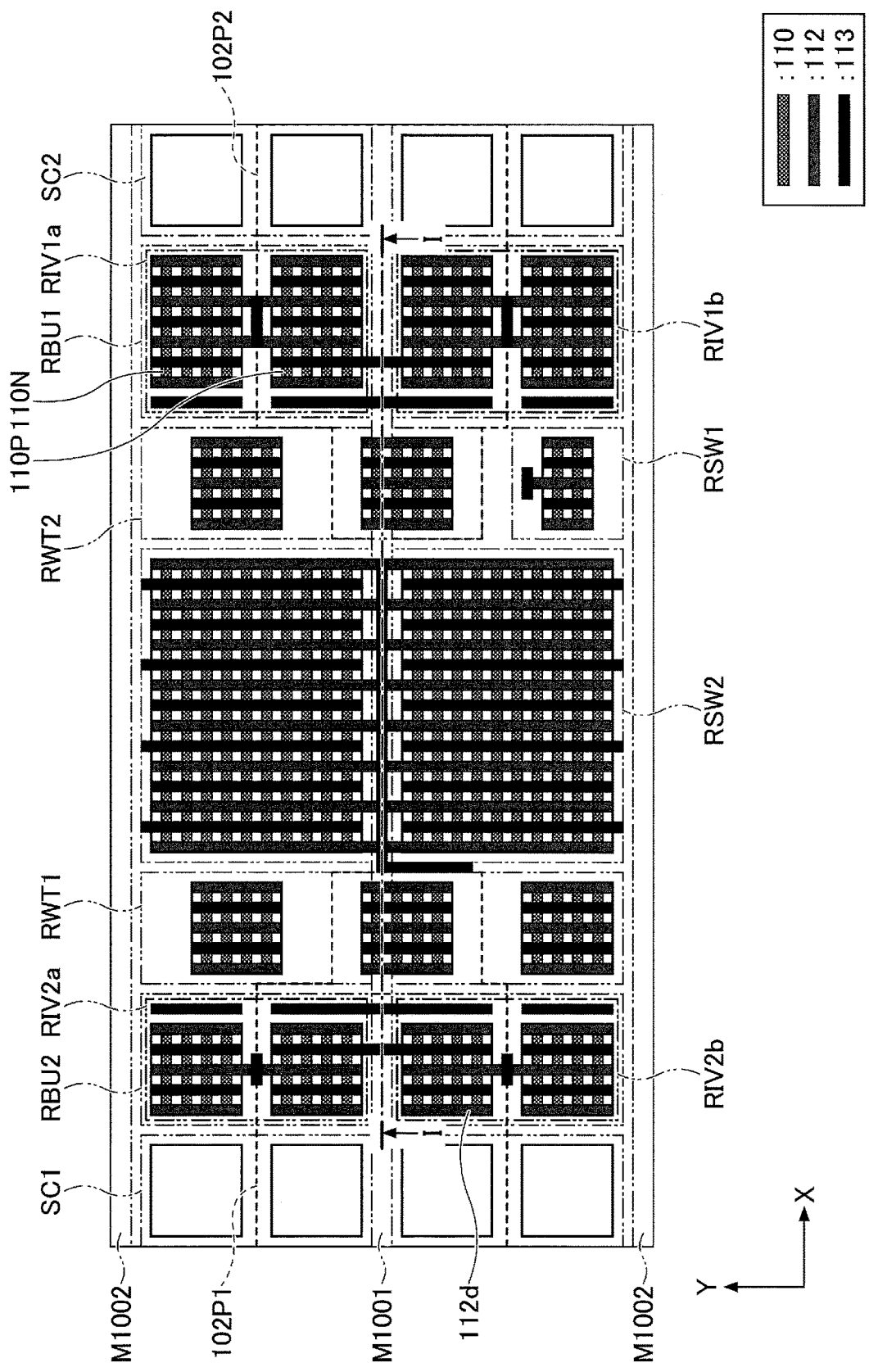
FIG. 23 is a diagram illustrating, in a plan view, an example of a configuration of fins, gate electrodes and local interconnects according to a fourth embodiment.
Figure 24:
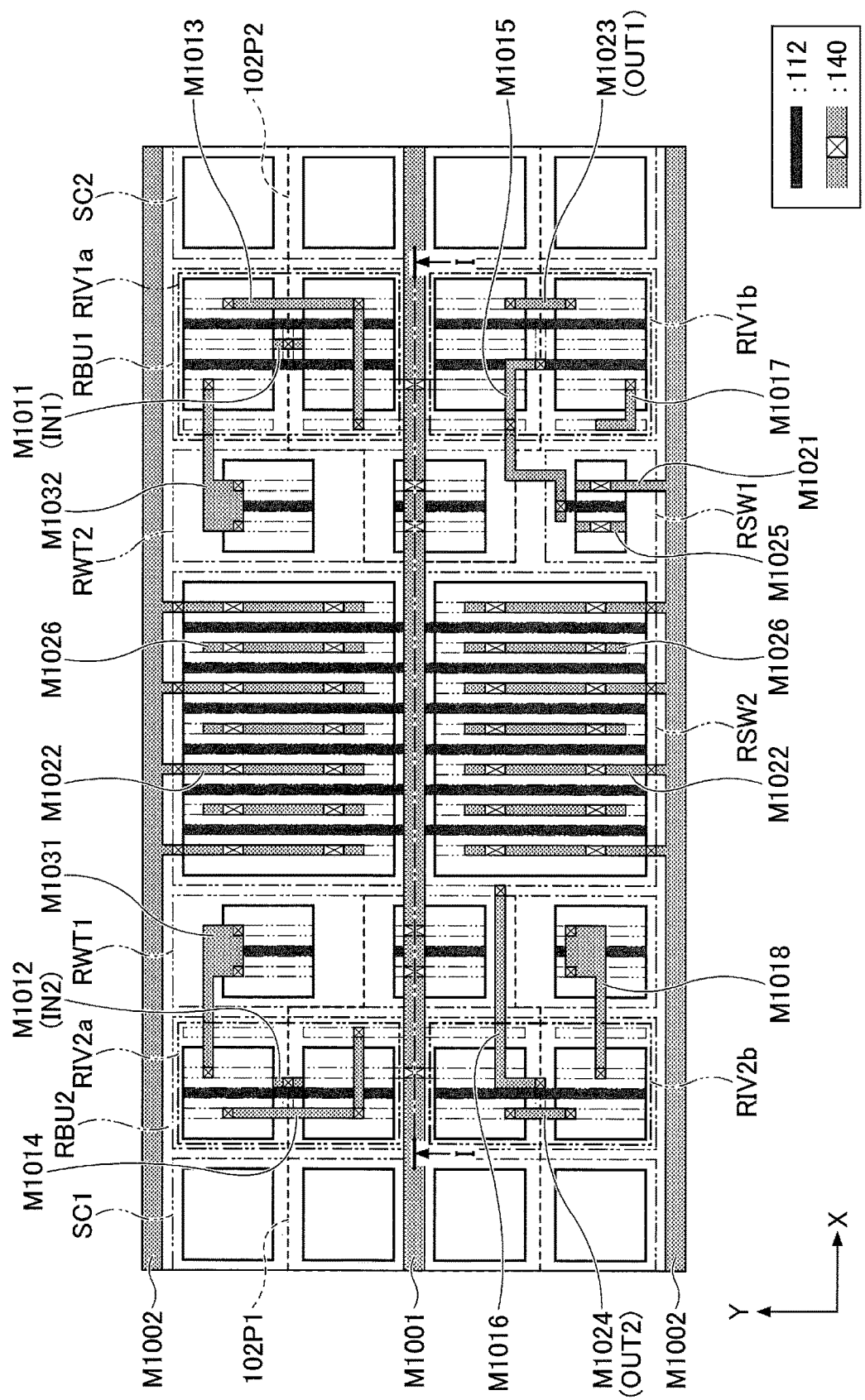
FIG. 24 is a diagram illustrating, in a plan view, an example of a relationship with respect to a first interconnect layer, the gate electrodes and the local interconnects according to the fourth embodiment.
Figure 25:
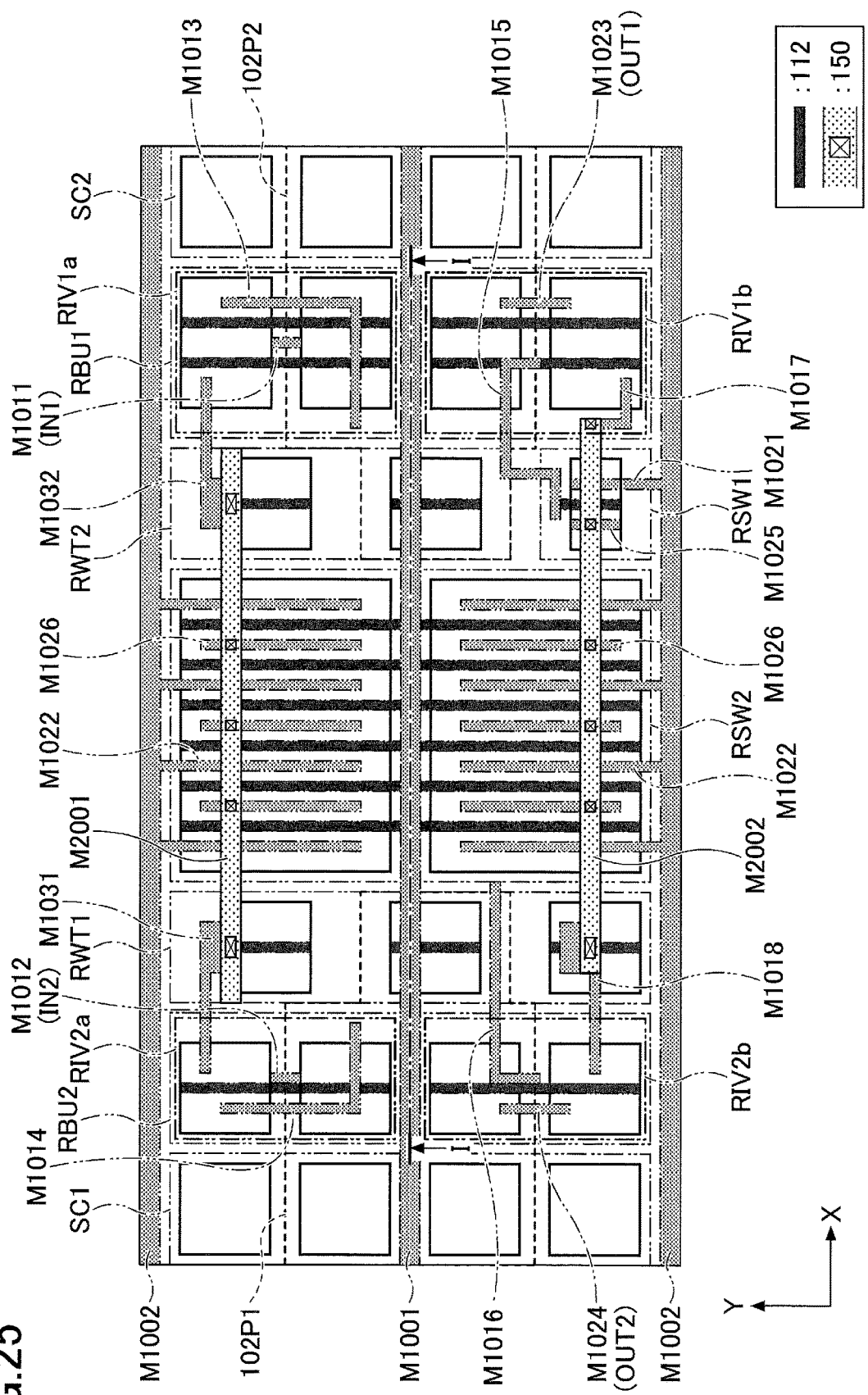
FIG. 25 is a diagram illustrating, in a plan view, an example of a relationship between a second interconnect layer and the first interconnect layer according to the fourth embodiment.
Figure 26:
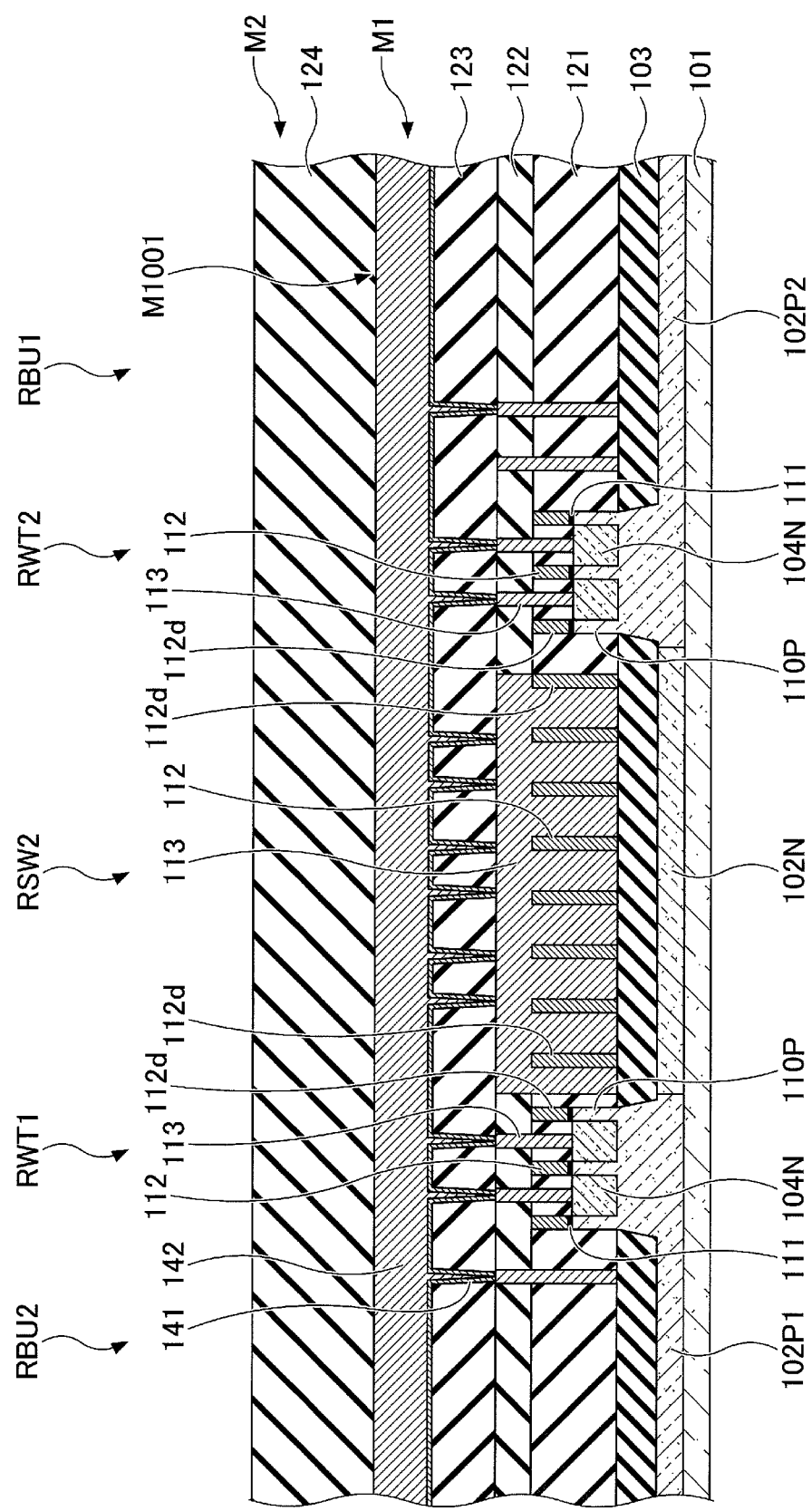
FIG. 26 is a cross-sectional view illustrating an example of a configuration of a semiconductor device according to the fourth embodiment.

A fourth embodiment is described hereafter. The fourth embodiment differs from the third embodiment, in that gates included in a region RSW2 are connected to a common local interconnect 113. FIG. 23 is a diagram illustrating an example of a configuration of fins, gate electrodes and local interconnects according to the fourth embodiment. FIG. 24 is a diagram illustrating, in a plan view, an example of a relationship with respect to a first interconnect layer, the gate electrodes and the local interconnects according to the fourth embodiment. FIG. 25 is a diagram illustrating, in a plan view, an example of a relationship between a second interconnect layer and the first interconnect layer according to the fourth embodiment. FIG. 26 is a cross-sectional view illustrating an example of a configuration of a semiconductor device according to the fourth embodiment. FIG. 26 is a cross-sectional view taken along line I-I in FIGS. 23 to 25. FIGS. 23 to 26 illustrate an area between two adjacent VVdd interconnects in the Y direction.

As illustrated in FIGS. 23 to 26, in the fourth embodiment, gates in the region RSW2 are commonly connected to a portion of the local interconnects 113. In a plan view, the portion of the local interconnects 113 that overlaps the gates in the active region RSW2 is situated between the active region ASW21 and the active region ASW22. Another portion of the local interconnects extends in a Y direction, and its portion end is situated between an interconnect M1001 and an interconnect M1002 in an active region AWT13. An interconnect M1016 is connected to said another portion of the local interconnects 113 at a position between the interconnect M1001 and the interconnect M1002 in the active region AWT13. Also, the interconnect M1001 linearly extends in the X direction in the middle of the two interconnects M1002.

Other configurations are same as the third embodiment. Note that the interconnects 113 and M1001 in the present embodiment may apply to the first embodiment.

The fourth embodiment can have a similar effect to the third embodiment. In the fourth embodiment, the interconnect M1001 linearly extends, thereby decreasing a parasitic resistance of the interconnect M1001.

The embodiments have been described, but are not limited to the requirements described in the embodiments. It will be appreciated by those skilled in the art that modifications, combinations or alternative to the configurations of the foregoing embodiments are made within the scope of the present invention or the equivalent thereof. The above requirements can be appropriately defined in an application manner.

What is claimed is:

1. A semiconductor device, comprising:
a semiconductor substrate;
a first standard cell including a first fin and a second fin; and
a power switching circuit including a first switching transistor electrically connected between a first interconnect and a second interconnect, and including a first buffer connected to a gate of the first switching transistor, the first buffer including a third fin and a fourth fin, and including a first well tap,
wherein the first buffer adjoins the first standard cell in a first direction in a plan view, the first buffer is disposed between the first well tap and the first standard cell in a plan view,
an arrangement of the first fin matches an arrangement of the third fin in a second direction different from the first direction, and
an arrangement of the second fin matches an arrangement of the fourth fin in the second direction.

2. The semiconductor device according to claim 1, wherein the first fin and the second fin are arranged side by side in the second direction in a plan view, and
wherein the third fin and the fourth fin are arranged side by side in the second direction in a plan view.

3. The semiconductor device according to claim 1, further comprising a second standard cell including a fifth fin and sixth fin, and
wherein the power switching circuit is positioned, in a plan view, between the first standard cell and the second standard cell,
wherein the power switching circuit includes a second switching transistor electrically connected between the first interconnect and the second interconnect, and includes a second buffer connected to a gate of the second switching transistor, the second buffer including a seventh fin and an eighth fin,
wherein the second buffer adjoins, in a plan view, the second standard cell in the first direction,
wherein an arrangement of the fifth fin matches an arrangement of the seventh fin in the second direction, and
wherein an arrangement of the sixth fin matches an arrangement of the eighth fin in the second direction.

4. The semiconductor device according to claim 3, wherein the power switching circuit includes a second well tap, and
wherein the second buffer is disposed, in a plan view, between the second well tap and the second standard cell.

5. The semiconductor device according to claim 3, wherein the fifth fin and the sixth fin are arranged side by side in the second direction in a plan view, and
wherein the seventh fin and the eighth fin are arranged side by side in the second direction in a plan view.

6. The semiconductor device according to claim 1, further comprising:
another first interconnect;
a third interconnect disposed, in a plan view, between two first interconnects being the first interconnect and said another first interconnect, the two first interconnects being arranged, in a plan view, in the second direction, the third interconnect being configured to be supplied with a potential different from a potential of the first interconnects; and
a fourth interconnect electrically connected to a gate electrode of the first switching transistor, the fourth interconnect being formed in a same interconnect layer as the third interconnect, and
wherein in an area where the power switching circuit is situated, the third interconnect includes, in a plan view, two first portions extending in the second direction and a second portion extending in the first direction and being connected to the two first portions, such that the second portion is displaced in the second direction with respect to a position of the third interconnect where the power switching circuit is not situated, and
wherein at least a portion of the fourth interconnect is positioned, in a plan view, between the two first portions.

7. The semiconductor device according to claim 1, further comprising:
another first interconnect;
a third interconnect disposed, in a plan view, between two first interconnects being the first interconnect and said another first interconnect, the two first interconnects being arranged, in a plan view, in the second direction, the third interconnect being configured to be supplied with a potential different from a potential of the first interconnects; and a fourth interconnect over the semiconductor substrate, the fourth interconnect being formed in an interconnect layer under the third interconnect, the fourth interconnect including a portion connected to a gate electrode of the first switching transistor at a position where the fourth interconnect overlaps the third interconnect in a plan view.

8. The semiconductor device according to claim 6, further comprising a ninth fin and a tenth fin arranged side by side in the second direction in a plan view, and
wherein in the second direction, a size of a region in which the ninth fin is disposed matches a size of a region in which the tenth fin is disposed.

9. The semiconductor device according to claim 8, wherein in a plan view, a portion of the fourth interconnect overlapping the gate electrode of the first switching transistor is positioned between the ninth fin and the tenth fin in the second direction.

* * * * *